United States Patent
Bucklew et al.

(10) Patent No.: US 12,332,372 B2
(45) Date of Patent: *Jun. 17, 2025

(54) SENSOR RECEIVER HAVING RYDBERG CELL AND RF DATA RATE GREATER THAN RECIPROCAL OF TEMPORAL PULSE WIDTH AND ASSOCIATED METHODS

(71) Applicant: Eagle Technology, LLC, Melbourne, FL (US)

(72) Inventors: Victor G. Bucklew, Richmond, VA (US); James Drakes, Occoquan, VA (US); Samuel H. Knarr, Melbourne, FL (US); Donna M. Kocak, Satellite Beach, FL (US); Tachaka Ray, Melbourne, FL (US); Nicholas Alban, Palm Bay, FL (US); Kendra Kordack, Palm Bay, FL (US); Uma Shanker Jha, Indian Harbour Beach, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 278 days.

This patent is subject to a terminal disclaimer.

(21) Appl. No.: 18/187,783

(22) Filed: Mar. 22, 2023

(65) Prior Publication Data
US 2023/0221406 A1     Jul. 13, 2023

Related U.S. Application Data

(63) Continuation-in-part of application No. 17/457,061, filed on Dec. 1, 2021, now Pat. No. 11,815,538,
(Continued)

(51) Int. Cl.
*G01S 7/03* (2006.01)
*H01Q 19/00* (2006.01)

(52) U.S. Cl.
CPC ............. *G01S 7/032* (2013.01); *H01Q 19/00* (2013.01)

(58) Field of Classification Search
CPC ..................................................... G01R 29/088
(Continued)

(56) References Cited

U.S. PATENT DOCUMENTS 4,215,320 A * 7/1980 Chang .................. H01S 3/227
                                                                372/4
4,604,577 A * 8/1986 Matsumura ........... G02F 1/0036
                                                                359/324

(Continued)

FOREIGN PATENT DOCUMENTS

WO      2010082932         7/2010
WO      WO-2010082932 A1 * 7/2010 ........... G01R 33/032

OTHER PUBLICATIONS

Meyer et al., "Assessment of Rydberg Atoms for Wideband Electric Field Sensing," J. Phys. B: At. Mol. Opt. Phys. 53 034001; Jan. 2020; 16 pages. See Priority U.S. Appl. No. 17/445,316, filed Aug. 18, 2021.
(Continued)

*Primary Examiner* — Christopher P McAndrew
(74) *Attorney, Agent, or Firm* — ALLEN, DYER, DOPPELT + GILCHRIST, P.A.

(57) ABSTRACT

A sensor receiver may include a Rydberg cell configured to be exposed to a radio frequency (RF) signal having an RF data rate, and a probe source configured to generate a plurality of spaced apart pulsed probe beams within the Rydberg cell. Each pulse may have a temporal pulse width so that the RF data rate is greater than the reciprocal of the temporal pulse width. At least one excitation source may be coupled to the Rydberg cell. A detector may be positioned
(Continued)

downstream from the Rydberg cell. The sensor receiver may be used in a RADAR system.

38 Claims, 19 Drawing Sheets

Related U.S. Application Data which is a continuation-in-part of application No. 17/445,316, filed on Aug. 18, 2021, now Pat. No. 11,598,798.

(58) Field of Classification Search
USPC .......................................................... 324/96
See application file for complete search history.

(56) References Cited

U.S. PATENT DOCUMENTS

| | | | |
|---|---|---|---|
| 9,970,973 | B2 | 5/2018 | Anderson et al. |
| 10,509,065 | B1* | 12/2019 | Shaffer ............... G01R 29/0885 |
| 10,605,840 | B1* | 3/2020 | Amarloo ............ G01R 29/0885 |
| 10,823,775 | B2 | 11/2020 | Anderson et al. |
| 11,533,101 | B1* | 12/2022 | Pecen .................... H01Q 15/24 |
| 11,598,798 | B1 | 3/2023 | Bucklew et al. |
| 11,681,016 | B1* | 6/2023 | Bohaichuk ......... G01R 29/0885 342/195 |
| 2011/0080580 | A1* | 4/2011 | Fermann ............ G01N 21/4795 372/18 |
| 2011/0080588 | A1 | 4/2011 | Fermann et al. |
| 2013/0027051 | A1* | 1/2013 | Ouyang ........... G01R 31/31728 324/501 |
| 2019/0187198 | A1* | 6/2019 | Anderson .......... G01R 29/0878 |
| 2020/0096567 | A1* | 3/2020 | Diglio ................ G01R 1/07357 |
| 2020/0136727 | A1 | 4/2020 | Graceffo et al. |
| 2020/0161446 | A1* | 5/2020 | Anderson .............. B82Y 20/00 |
| 2020/0233025 | A1* | 7/2020 | Salim ................. G01R 29/0885 |
| 2020/0292606 | A1* | 9/2020 | Holloway .......... G01R 29/0892 |
| 2020/0295838 | A1 | 9/2020 | Gordon et al. |
| 2021/0048465 | A1 | 2/2021 | Anderson et al. |
| 2023/0059575 | A1 | 2/2023 | Bucklew et al. |

OTHER PUBLICATIONS

Mohl et al., "Photon Correlation Transients in a Weakly Blockaded Rydberg Ensemble," Journal of Physics B: Atomic, Molecular and Optical Physics; Mar. 2020; pp. 1-7. See Priority U.S. Appl. No. 17/445,316, filed Aug. 18, 2021.
Sapiro et al., "Time Dependence of Rydberg EIT in Pulsed Optical and RF Fields," Journal of Physics B: Atomic, Molecular and Optical Physics; Apr. 2020; pp. 1-10. See Priority U.S. Appl. No. 17/445,316, filed Aug. 18, 2021.
Thaicharoen et al., "Electromagnetically-Induced Transparency, Absorption, and Microwave Field Sensing in a Rb Vapor Cell with a Three-Color All-Infrared Laser System," University of Michigan Department of Physics, Rydberg Technologies, Inc.; May 2019; pp. 1-9. See Priority U.S. Appl. No. 17/445,316, filed Aug. 18, 2021.
Anderson et al., "Rydberg Atoms for Radio-Frequency Communications and Sensing: Atomic Receivers for Pulsed RF Field and Phase Detection," IEEE Age Systems Magazine; Apr. 2020; pp. 48-56. See Priority U.S. Appl. No. 17/457,061, filed Dec. 1, 2021.
Abel, "Coherent Excitation of Ultracold Atoms Between Ground and Rydberg States," Durham University; Aug. 2011; pp. 1-150. See Priority U.S. Appl. No. 17/457,061, filed Dec. 1, 2021.
Arumugam, Darmindra, "Cryospheric Rydberg Radar," NASA TV; /multimedia/nasatv/index.html; Feb. 2022; 2 pages.
Bussey et al., "Rydberg RF Receiver Operation to Track RF Signal Fading and Frequency Drift," Journal of Lightwave Technology; vol. 39, No. 24; Dec. 15, 2021; pp. 7813-7820.
Cerutti-Maori et al., "Preliminary Concept of a Space-Based Radar for Detecting MM-Size Space Debris," Proceedings of 7th European Conference on Space Debris, Darmstadt, Germany; Apr. 2017; published by the ESA Space Debris Office; pp. 1-12.
Cheong et al., "Yagi-Uda Antenna for Multiband Radar Applications," IEEE Antennas and Wireless Propagation Letters; vol. 13; 2014; pp. 1065-1068.
Jing et al., "Atomic Superheterodyne Receiver Based on Microwave-Dressed Rydberg Spectroscopy," Nature Physics; vol. 16; Sep. 2020; pp. 911-915.
Meyer et al., "Simultaneous Multiband Demodulation Using a Rydberg Atomic Sensor," Physical Review Applied; vol. 19; 014025; 2023; pp. 1-9.
"Limiting Future Collision Risk to Spacecraft: An Assessment of NASA's Meteoroid and Orbital Debris Programs," National Academy of Sciences, National Academy of Engineering, Institute of Medicine, National Research Council; Aeronautics and Space Engineering Board, Division on Engineering & Physical Sciences; Sep. 2011; 4 pages.
"New Quantum Receiver the First to Detect Entire Radio Frequency Spectrum," Provided by The Army Research Laboratory; phys.org; Feb. 4, 2021; Retrieved from the internet: https://phys.org/news/2021-02-quantum-entire-radio-frequency-spectrum.html; pp. 1-5.
Uppal, Rajesh, "Militaries Developing Quantum Receiver Employing Rydberg Atoms for Ultrasensitive, Ultrawideband and Fast Soldier Communications," Comm. & NW, Quantum, Soldier; Jul. 27, 2021; pp. 1-11.
Van Dorp et al., "High Resolution Radar Imaging Using Coherent Multiband Processing Techniques," Radar Department, TNO Defence, Security and Safety; The Hague, The Netherlands; Downloaded from IEEE Xplore on Feb. 6, 2023; pp. 981-986.
Vespe et al., "Automatic Target Recognition Using Multi-Diversity Radar," IET Radar, Sonar & Navigation; vol. 1, No. 6; Dec. 2007; pp. 1-23.
Wei et al., "Multi-band SAR Images Fusion Using the EM Algorithm in Contourlet Domain," Downloaded from IEEE Xplore on Feb. 6, 2023; pp. 1-5.
Zhang et al., "Reconfigurable Multi-band Microwave Photonic Radar Transmitter with a Wide Operating Frequency Range," Optics Express; vol. 27, No. 24; Nov. 25, 2019; pp. 34519-34529.
Robinson et al., "Determining the angle-of-arrival of a radio-frequency source with a Rydberg atom-based sensor", Applied Physics Letters 118.114001, Mar. 2021, pp. 118.114001.1-118. 114001-5.

* cited by examiner

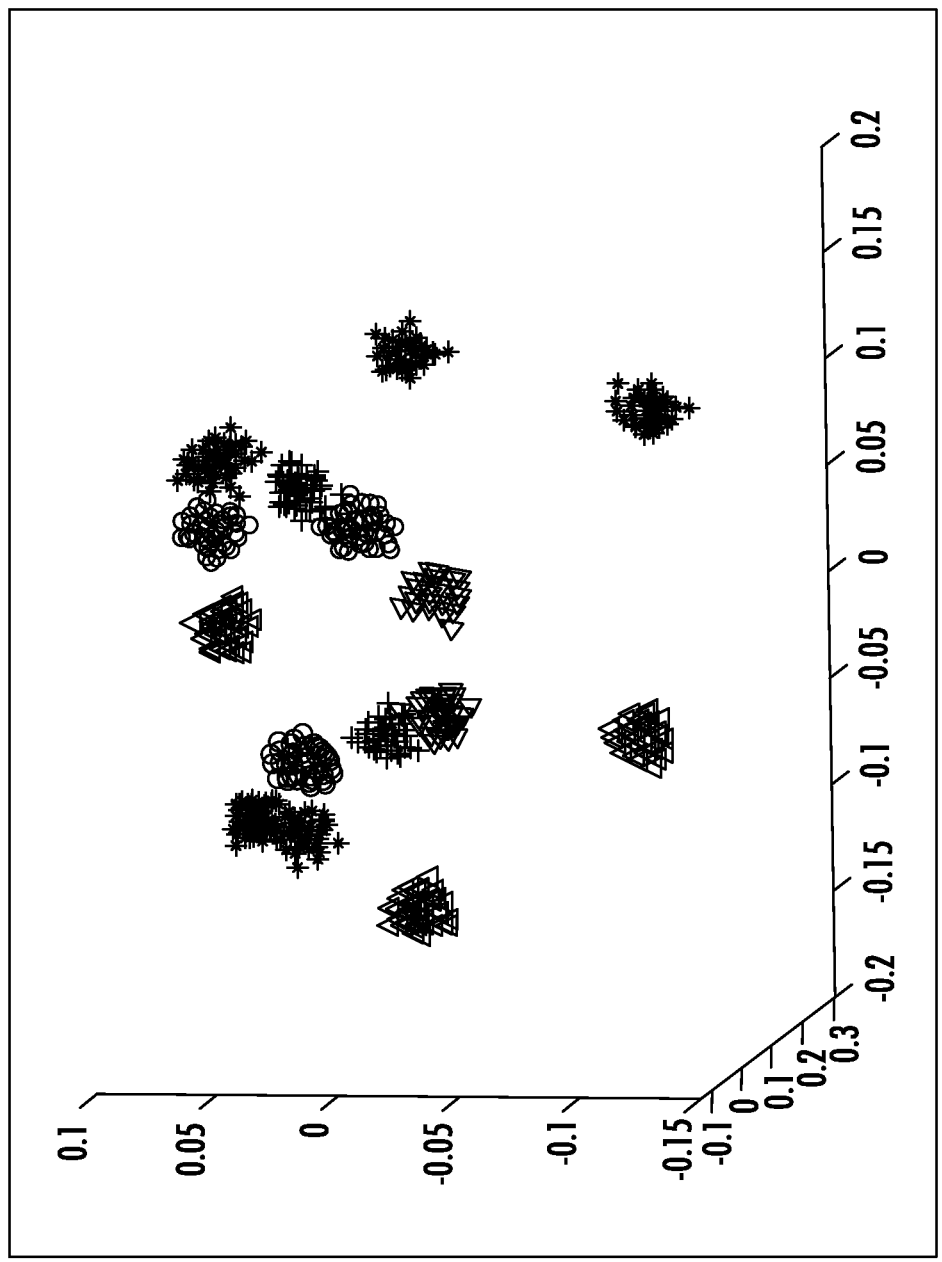

SENSOR RECEIVER HAVING RYDBERG CELL AND RF DATA RATE GREATER THAN RECIPROCAL OF TEMPORAL PULSE WIDTH AND ASSOCIATED METHODS

PRIORITY APPLICATION(S)

This is a continuation-in-part application based upon U.S. patent application Ser. No. 17/457,061 filed Dec. 1, 2021, which is a continuation-in-part application based upon U.S. patent application Ser. No. 17/445,316 filed Aug. 18, 2021 (now U.S. Pat. No. 11,598,798 issued Mar. 7, 2023), the disclosures which are hereby incorporated by reference in their entirety.

FIELD OF THE INVENTION

The present invention relates to Rydberg atom-based sensors, and, more particularly, to a sensor receiver that includes a Rydberg cell and related methods.

BACKGROUND OF THE INVENTION

Radio frequency (RF) signals are generated and received in communications, sensing, and intelligence applications across a wide range of commercial markets and government divisions. Emerging RF applications are pushing requirements to higher frequency ranges with new waveforms that are difficult to detect and require RF receivers or sensors that have increased sensitivity. As RF channels become more heavily crowded, there is a desire to push to alternative RF bands spanning from 0 to 100 GHz and beyond. While some RF sensors span multiple bands, most are band-limited and can cover only a few tens of GHz, with a typical upper limit of about 40 GHz, e.g., Ka band. Also, most state-of-the-art RF receivers are not compatible with new waveforms used in emerging distributed sensing networks, new forms of the Global Positioning System (GPS), and new RF applications that are not served with existing narrow band antenna-based receivers. Many state-of-the-art RF receivers and sensors do not have the sensitivity required for these next generation RF applications.

Conventional RF devices that incorporate RF antennas have a high technology readiness level (TRL) and are used in almost every modern RF sensing or communications system. There are limitations with RF antennas, however, because they are Size, Weight and Power (SWaP) limited. The antenna is also on the order of the RF wavelength of radiation, and the RF coverage is over a relatively narrow frequency band, such as 1-10 GHz or 20-40 GHz. Many conventional RF receivers and antenna designs are not compatible with emerging waveforms and may lack sensitivity, making them difficult to cover wide bandwidths, such as 0-100 GHz with high sensitivity.

To address these limitations, Rydberg atom-based RF sensors have been developed, which convert the response of an atomic vapor to incoming RF radiation into measurable changes in an optical probe. These RF sensors provide a new model for RF sensing with increased sensitivity. For example, conventional antennas may provide at most about −130 to −160 dBi (decibels relative to an isotropic radiator), but with Rydberg system sensitivity, it can be up to about 170-180 dBi with a broader range coverage in a single receiver from KHz to THz.

In a Rydberg atom-based RF sensor, the measurement is based upon the attenuation of a probe laser due to absorption in a small room temperature vapor cell filled with alkali atoms, such as rubidium (Rb) or cesium (Cs). Atoms are simultaneously excited into a "Rydberg" state with both a coupling and probe. These Rydberg states are very responsive to local electric fields and the response of the atom to an external electric field, such as an RF signal, alters the measured attenuation of the probe laser and is detected by a probe laser photo detector. The magnitude of the electric field component of the incoming RF radiation may be determined by measuring the spectral splitting of two features in the probe laser absorption spectrum. This may be from Electromagnetically Induced Transparency (EIT) and Autler-Townes (AT) splitting.

Current Rydberg atom-based RF sensors may have low sampling rates that are set by the slow response time of the atomic system. Current Rydberg atom-based RF sensors also may be limited by their latency, due to the need for scanning the probe laser across the atomic absorption feature. Data speeds in current Rydberg atom-based RF sensors are also limited by atomic relaxation times to a few megahertz and require time-consuming probe scanning protocols to extract relevant spectroscopic features. At RF frequencies below 1 GHz, the Rydberg atomic-based RF sensors may require an RF local oscillator for reliable detection.

SUMMARY OF THE INVENTION

In general, a sensor receiver may include a Rydberg cell configured to be exposed to a radio frequency (RF) signal having an RF data rate. A probe source may be configured to generate a plurality of spaced apart pulsed probe beams within the Rydberg cell, with each pulse having a temporal pulse width so that the RF data rate is greater than the reciprocal of the temporal pulse width. At least one excitation source may be coupled to the Rydberg cell. A detector may be positioned downstream from the Rydberg cell.

In an example, a radar pulse receiving antenna may be coupled to the Rydberg cell. The pulsed probe beams may be offset in time from one another. The at least one excitation source may comprise a plurality of excitation lasers. The plurality of excitation lasers may also have different frequencies. Each of the plurality of excitation lasers may comprise a continuous laser.

The probe source may be configured to generate the plurality of spaced apart pulsed probe beams without scanning. The probe source may comprise an optical source, and a pulse shaper downstream from the optical source. The probe source may comprise a beam splitter downstream from the pulse shaper, and a respective optical delay element in a path of each beam downstream from the beam splitter. Each optical delay element may comprise a respective different length of optical fiber.

A first microlens may be adjacent a first side of the Rydberg cell, and a second microlens may be adjacent a second side of the Rydberg cell. A controller may be coupled to the Rydberg cell, probe source, plurality of excitation sources, and detector. The plurality of excitation sources may be coupled to the Rydberg cell in a counter-propagating direction from the probe source. A processor may be coupled to the detector and configured to classify RF bit sequences based upon temporal profiles of detected pulses.

A radar may comprise a radar transmitter and a radar receiver cooperating therewith. The radar receiver may comprise a Rydberg cell configured to be exposed to a radar return signal, a probe source configured to generate a plurality of spaced apart pulsed probe beams within the Rydberg cell, at least one excitation source coupled to the Rydberg cell, and a detector downstream from the Rydberg cell.

In an example, the radar receiver may be configured to receive the radar return signal over a plurality of spaced apart frequency bands. An object classifier may be coupled to the detector.

Another aspect is directed to a method for receiving a radio frequency (RF) signal having an RF data rate. The method may comprise exposing a Rydberg cell to the RF signal and operating a probe source to generate a plurality of spaced apart pulsed probe beams within the Rydberg cell, with each pulse having a temporal pulse width so that the RF data rate is greater than the reciprocal of the temporal pulse width. The method may include operating at least one excitation source coupled to the Rydberg cell, and operating a detector downstream from the Rydberg cell.

A radar method may comprise operating a radar transmitter and operating a radar receiver in cooperation with the radar transmitter to expose a Rydberg cell to a radar return signal, operate a probe source to generate a plurality of spaced apart pulsed probe beams within the Rydberg cell, operate at least one excitation source coupled to the Rydberg cell, and operate a detector downstream from the Rydberg cell.

BRIEF DESCRIPTION OF THE DRAWINGS

Other objects, features and advantages of the present invention will become apparent from the detailed description of the invention which follows, when considered in light of the accompanying drawings in which:

FIG. 10B is another principal component analysis graph of a second example of RF bit sequences.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout.

Figure 1:
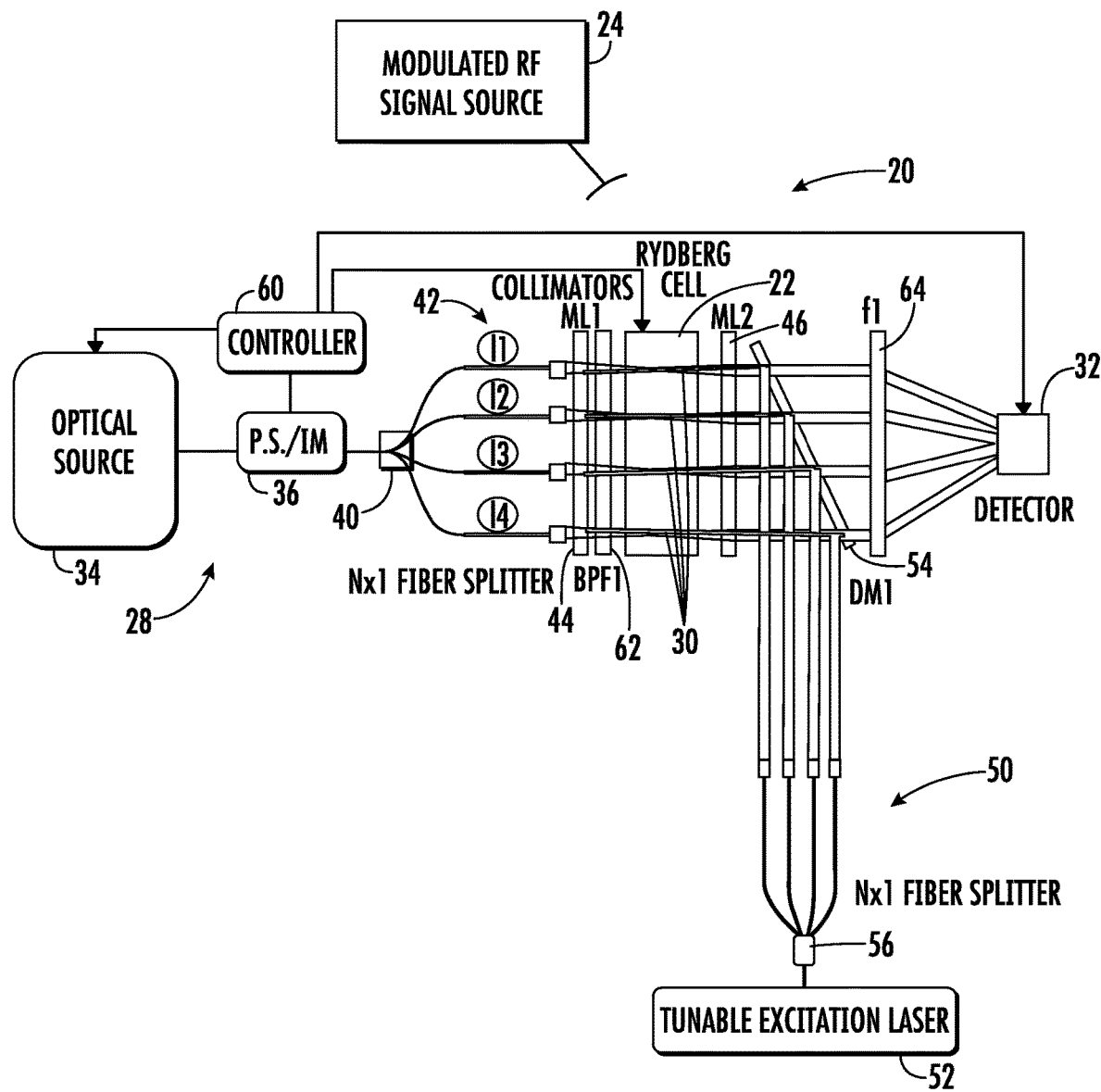
FIG. 1 is a schematic block diagram of the sensor receiver according to the invention.

Referring initially to FIG. 1, a sensor receiver is illustrated generally at 20 and includes a Rydberg cell 22 that is configured to be exposed to a radio frequency (RF) signal generated from a modulated RF signal source 24. This RF signal source 24 may include a non-modulated RF local oscillator. A probe source indicated generally at 28 is configured to generate a plurality of spaced apart pulsed probe beams within the Rydberg cell 22 and generally shown at 30, with the pulsed probe beams being offset in time from one another. It should be understood that one or more Rydberg cells may be used with the probe beams in multiple Rydberg cells. A detector 32 is positioned downstream from the Rydberg cell 22. In an example, the detector 32 is formed from a photodetector cell. The probe source 28 is configured to generate the plurality of spaced apart pulsed probe beams 30 in an example without scanning and may be formed as an optical source 34 and a pulse shaper 36 that is downstream from the optical source. The sensor receiver 20 may work with and without scanning the probe beam. The pulse shaper 36 may be an intensity modulator.

In an example, the probe source 28 includes a beam splitter 40, such as a N×1 fiber splitter, downstream from the pulse shaper 36 and a respective optical delay element 42 in a path of each beam downstream from the beam splitter. In a non-limiting example, each optical delay element 42 may be formed as a respective different length of optical fiber shown by the loops indicated as L1, L2, L3 and L4. Other delay mechanisms may be used besides fixed pulse delays, such as a changed optical fiber length, such as free space delay elements that may provide more temperature stability and delay tunability. In another non-limiting example, a first microlens 44 is positioned adjacent a first side of the Rydberg cell 22 and a second microlens 46 is positioned adjacent a second side of the Rydberg cell as illustrated by the designations ML1 and ML2.

An excitation source 50 as a coupling laser is coupled to the Rydberg cell 22 and formed, in an example, as a tunable excitation laser 52 and at least one mirror 54, such as a dichroic mirror downstream therefrom to input the output of the excitation laser and excite the rubidium or cesium used within the Rydberg cell 22. For a 4-beam version, as shown in FIG. 1, the N×1 fiber splitter 56 is a 4×1 splitter and may split the output into four beams from the excitation laser 50 corresponding to the illustrated four probe beams 30. A controller 60 is coupled to the Rydberg cell 22, the optical source 34 as the laser probe of the probe source 28 and detector 32. The delay mechanism may not only delay tunability as noted above, but also direct modulation temporal gating of one or more excitation lasers 52.

As illustrated, a bandpass filter (BPF1) 62 may be included to block the excitation laser 52 and pass the spaced apart probe beams 30. A plano convex lens (f1) 64 may focus the probe beams 30 to the detector 32. The first microlens 44 and bandpass filter 62 may be formed as a collimator device, e.g., a Thorlabs Part No. 50-780, and have a collimator output with about a 0.5 mm spot size beam at 780 nanometers as generated from the optical source 34 as a laser.

In an example, the Rydberg cell 22 is a rubidium Rydberg cell, such as Thorlabs part no. GC19075-RB. Other vapors of specific atomic elements may include Cesium (Cs), Potassium (K), Sodium (Na), and possibly Iodine (I). The sensor receiver 20 as illustrated will temporally and spectrally shape the signature of the pulsed probe beams 30, and thus, allows an increase in the sampling rate as proportional to the number of beams "N." Increasing the sampling rate is also dependent on the probe repetition rate. Separating the probe source 28 as a probe laser beam into N distinct pulses, each of which interrogates a distinct volume of the Rydberg cell 22, will increase the sampling of an incoming RF field in proportion to the number of beams "N." In addition to increasing the sampling rate, the bandwidth of the probe pulses may also help reduce the latency usually incurred by scanning the probe beam across the EIT spectrum. This may reduce the latency from about 1 to 2 orders of magnitude. The temporal pulse width of the probe determines its spectral bandwidth through a Fourier transform.

Figure 2:
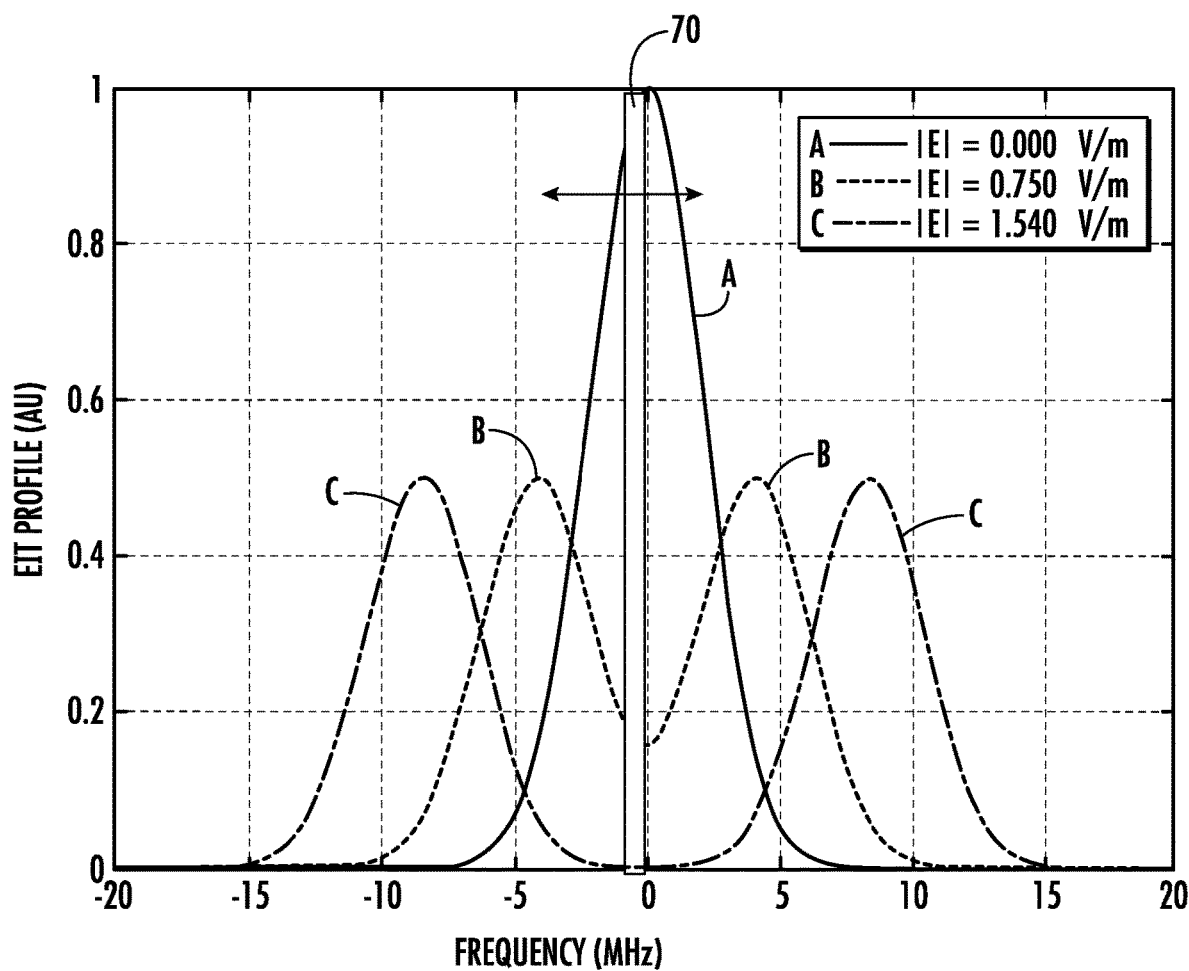
FIG. 2 is a graph showing a comparison between state-of-the-art sweeping of narrow band Rydberg sensor probes and the broadband response for the sensor receiver of FIG. 1.

It is possible to increase the probe bandwidth generated from the optical source 34 from about 100 KHz to about 200 MHz by choosing an appropriate pulse width. The incoming RF field may be mapped onto a spectroscopic fingerprint without scanning. For example, the graph in FIG. 2 shows a large vertical line 70 at 0 MHz frequency corresponding to the large EIT (Electromagnetically Induced Transparency) profile, which is indicative of how a state-of-the-art Rydberg sensor requires scanning of the narrow band probes. The sensor receiver 20 of FIG. 1, however, captures a response directly correlated to the integrated line absorption spectrum, i.e., the equivalent width for the case of the spectral character of the source propagating through the atomic vapor at/near the frequency of an atomic absorption line modified by the pressure of EIT and shown by the range of frequencies labeled A-C and indicative of the 0.0 (A) to 0.750 (B) and 1.540 V/m (C).

Figure 3A:
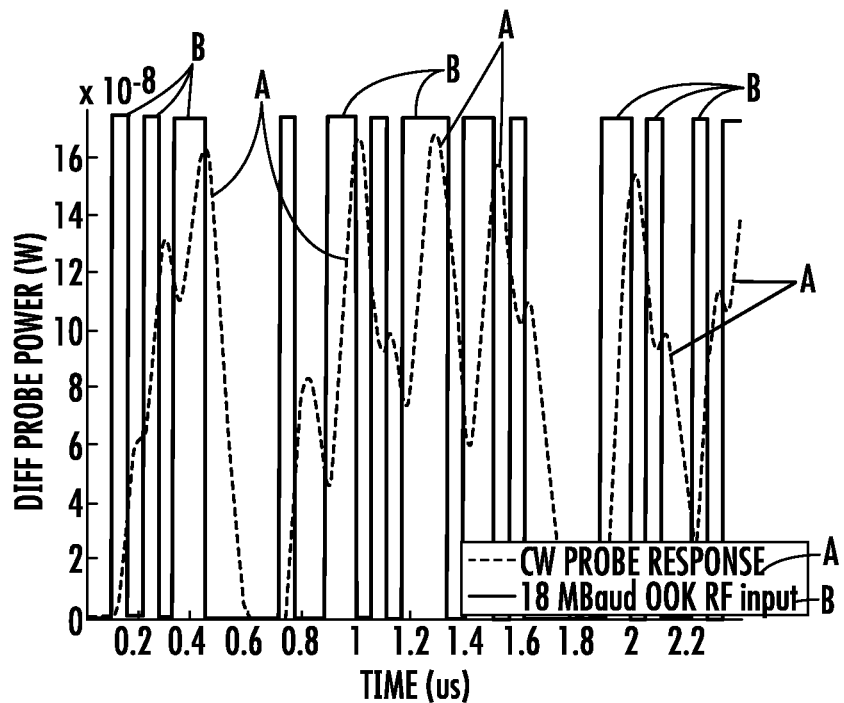
FIG. 3A is a graph showing the differential probe power versus time for a state-of-the-art Rydberg sensor.
Figure 3B:
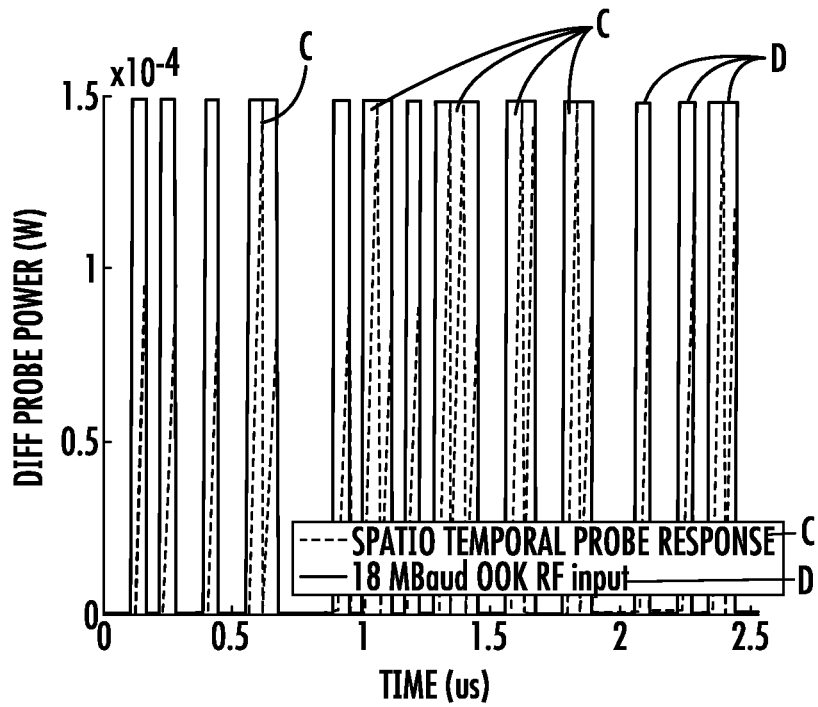
FIG. 3B is a graph similar to that shown in FIG. 3A, but for the sensor receiver of FIG. 1.

Referring now to FIGS. 3A and 3B, there are shown graphs where the state-of-the-art Rydberg sensor continuous wave probe signal shows that the atomic system cannot respond to changes in the external RF signal amplitude faster than its characteristic relaxation time. This is evident in waveforms such as that occurring in "on-off key" or OOK for sufficiently high data rates. This is shown in FIG. 3A, as compared to the sensor receiver 20 of FIG. 1 and where the graph in FIG. 3B shows the spatiotemporally multiplexed probe beam 30 that allows the atomic system to fully recover after it is probed. These two graphs in FIGS. 3A and 3B indicate that the sensor receiver 20 of FIG. 1 enables a higher signal-to-noise readout of higher-speed RF data streams. In these two examples, an 18 MBaud on off keyed (OOK) RF input was simulated.

As shown by the graph in FIG. 3A, corresponding to the state-of-the-art Rydberg sensor, as the RF data rate increases, the performance response degrades and the SNR goes down due to the probe response being predominantly limited by preventing the atomic system to relay to equilibrium before the next RF amplitude increase, i.e., its data bit, arrives. On the other hand, as shown in the graph of FIG. 3B, corresponding to the sensor receiver 20 of FIG. 1, as the RF data rate increases, performance does not degrade and the SNR remains at a high value and does not lead to bit errors because the sensor receiver is being probed in its fully recovered state.

Figure 4:
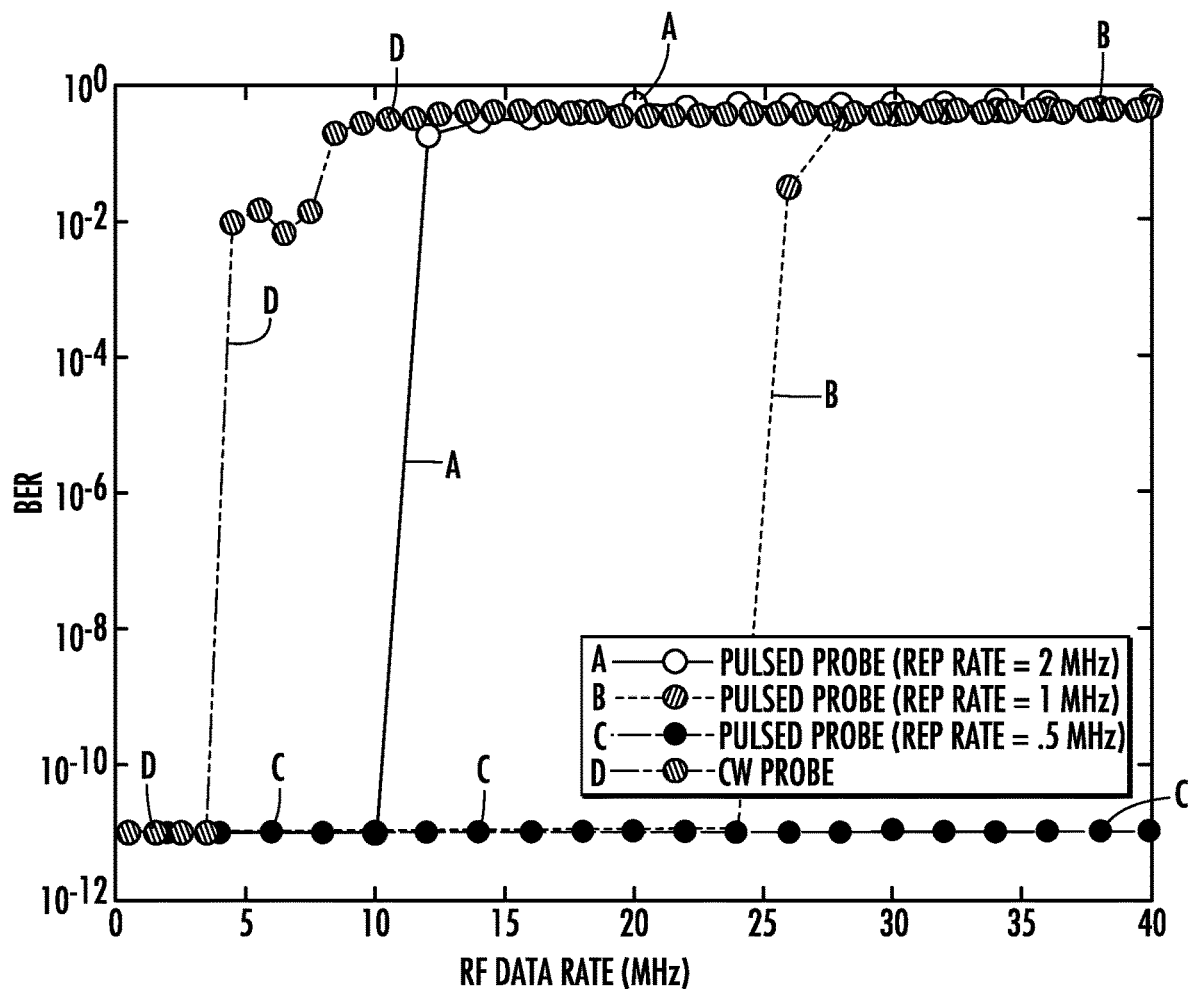
FIG. 4 is a graph comparing a state-of-the-art Rydberg sensor having a continuous wave probe with different pulsed probes of the sensor receiver of FIG. 1.

Referring now to FIG. 4, there is illustrated a graph that compares the bit error rate (BER) on the vertical axis of an RF OOK data stream with different rates for the state-of-the-art Rydberg atom-based sensor corresponding to the CW probe labeled by line D, and the sensor receiver 20 of FIG. 1, having different pulsed probes and a repetition rate of 2 MHz, 1 MHz, and 0.5 MHz shown by respective lines labeled A, B and C. The sensor receiver 20 of FIG. 1 can measure the RF data rates that are 15 times higher than possible with the state-of-the-art Rydberg sensors, for example, as from 3 MHz to 40+ MHz. The CW probe labeled by line D on the graph of FIG. 4 illustrates the state-of-the-art Rydberg sensor, while the pulsed probes labeled A, B and C are examples of the sensor receiver 20 of FIG. 1.

Figure 5A:
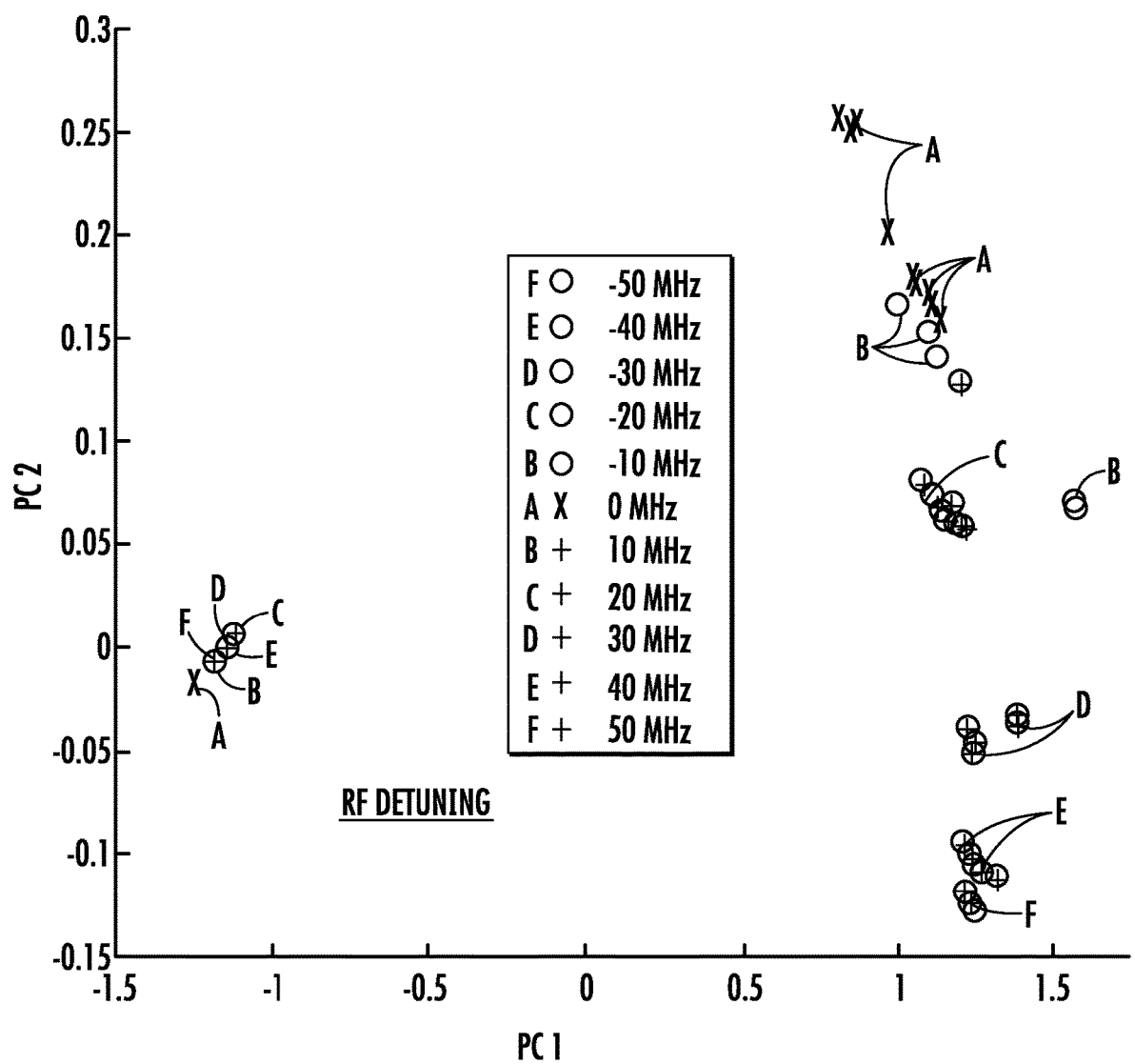
FIG. 5A is a graph showing principal component scores for a state-of-the-art Rydberg sensor.
Figure 5B:
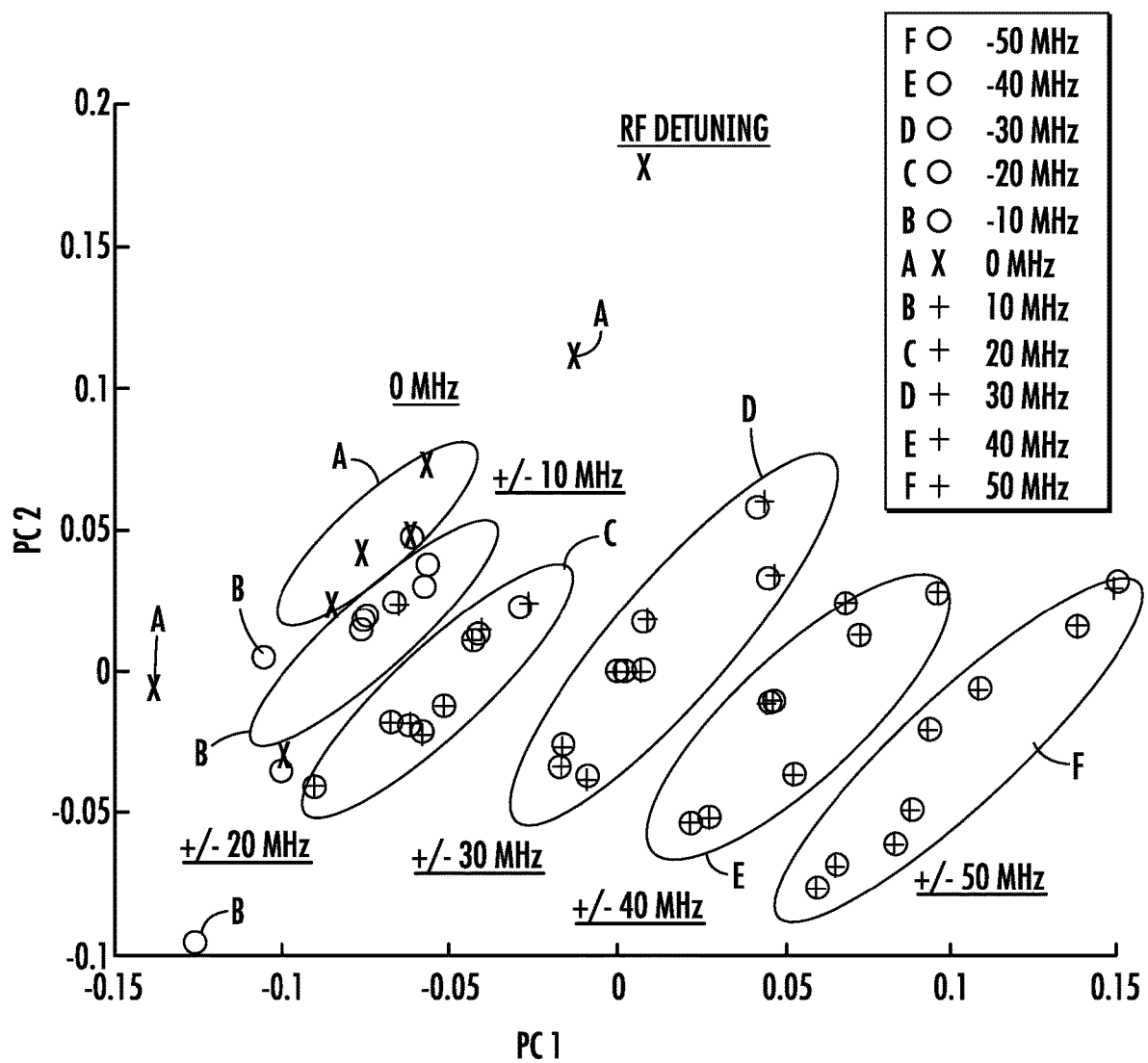
FIG. 5B is a graph showing the principal component scores for the sensor receiver of FIG. 1 showing that the data is separated based upon RF detuning.
Figure 5C:
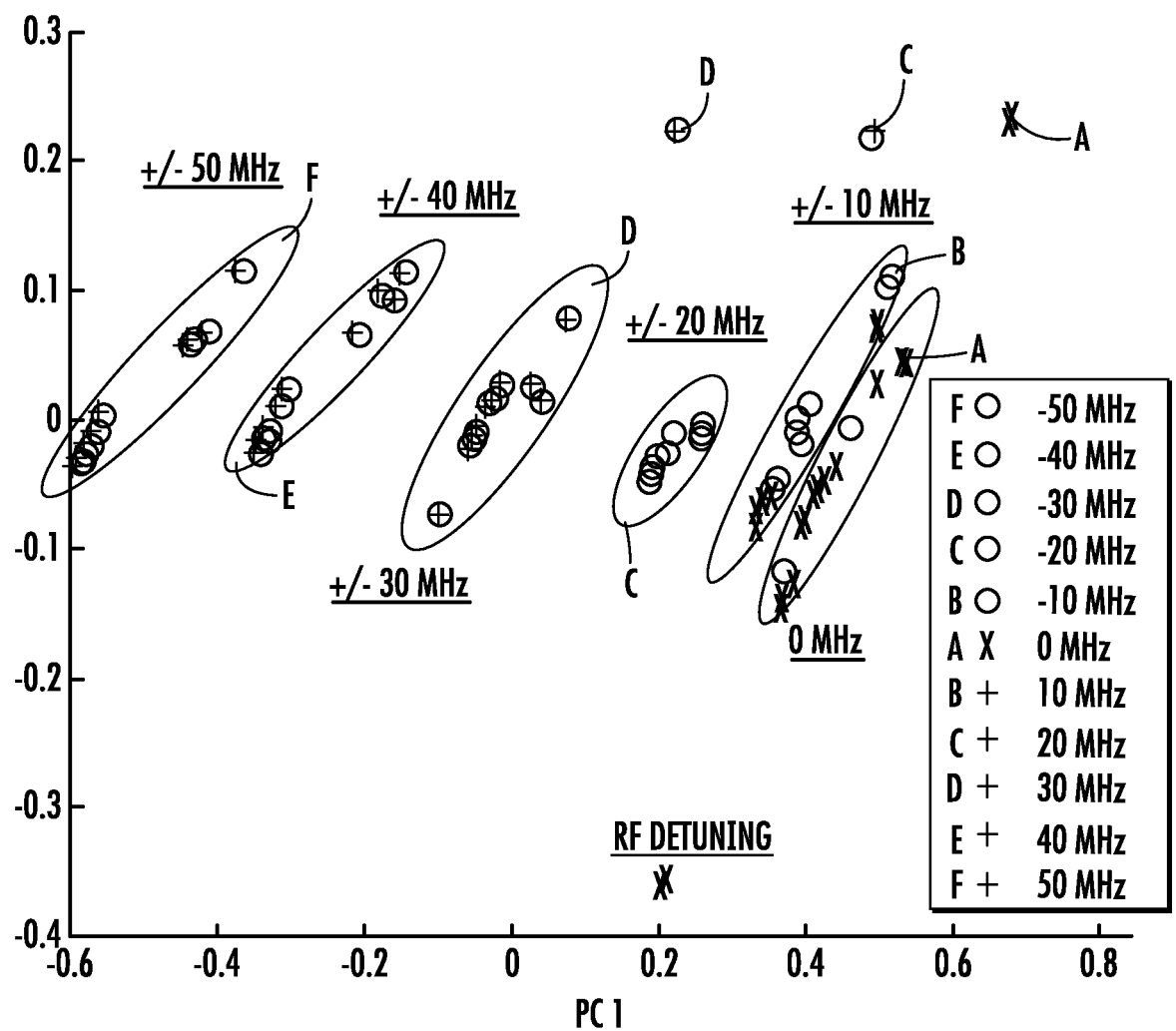
FIG. 5C is a graph showing the principal component scores for a sensor receiver of FIG. 1, but having a larger bandwidth than that sensor receiver of FIG. 5B.

Referring now to FIGS. 5A, 5B and 5C, there are illustrated graphs of how the sensor receiver 20 of FIG. 1 in the graphs of FIGS. 5B and 5C reduces latency and extracts the RF detuning of an incoming RF data stream without scanning the probe laser in comparison with the performance of a state-of-the-art Rydberg sensor as shown in FIG. 5A. FIG. 5B shows a graph of an example of the sensor receiver 20 of FIG. 1 with RF detuning without scanning, and in FIG. 5C with a larger bandwidth of the pulse probes.

As shown in FIG. 5A, based on the narrow spectrum of the continuous wave probe of a state-of-the-art Rydberg sensor, it may be difficult to extract reliable information about the RF detuning without scanning the probe beam from the laser. The two clusters of principal component (PC) scores for each RF detuning are illustrated on the left and the right in FIG. 5A. The left-hand side for the RF detuning at the different frequencies ranging from 0 MHz to +/−50 MHz is indistinguishable, while the right-hand side is more easily distinguishable. In the graph of FIG. 5B, on the other hand, it is evident that with the sensor receiver 20 having the pulsed probe architecture, the RF detuning data can be extracted without scanning the probe laser. The PC scores clearly separate the data based on the RF detuning as shown by the separated frequencies and labeled A-F.

In the graph of FIG. 5C, as the bandwidth of the pulsed probe increases when using the sensor receiver 20 of FIG. 1, there is greater ability to determine information about the RF detuning value. The PC scores between successive RF groups increases as the bandwidth of the probe increases as shown by the comparison of FIGS. 5B and 5C. The state-of-the-art Rydberg sensor as shown with its performance in FIG. 5A uses a probe laser as a continuous wave laser that spectrally scans the absorption feature. The sensor receiver 20 of FIG. 1, however, allows spatial-temporal multiplexing where multiple pulsed beams 30 may be in one Rydberg cell 22. Individual pulses of the probe laser are temporally separated and routed through unique spatial volumes of the Rydberg cell 22 and then recombined photonically prior to photo detection in the detector 32. The pulsed probe leverages the spectral content of the pulse to measure an output that can be correlated through post processing algorithms, to an RF detuning value while simultaneously measuring an incoming RF data stream. Pulsing the probe laser also increases the measurement rate of a single beam's absorption feature by replacing the slower spectral scanning techniques of the state-of-the-art Rydberg sensors.

Figure 6:
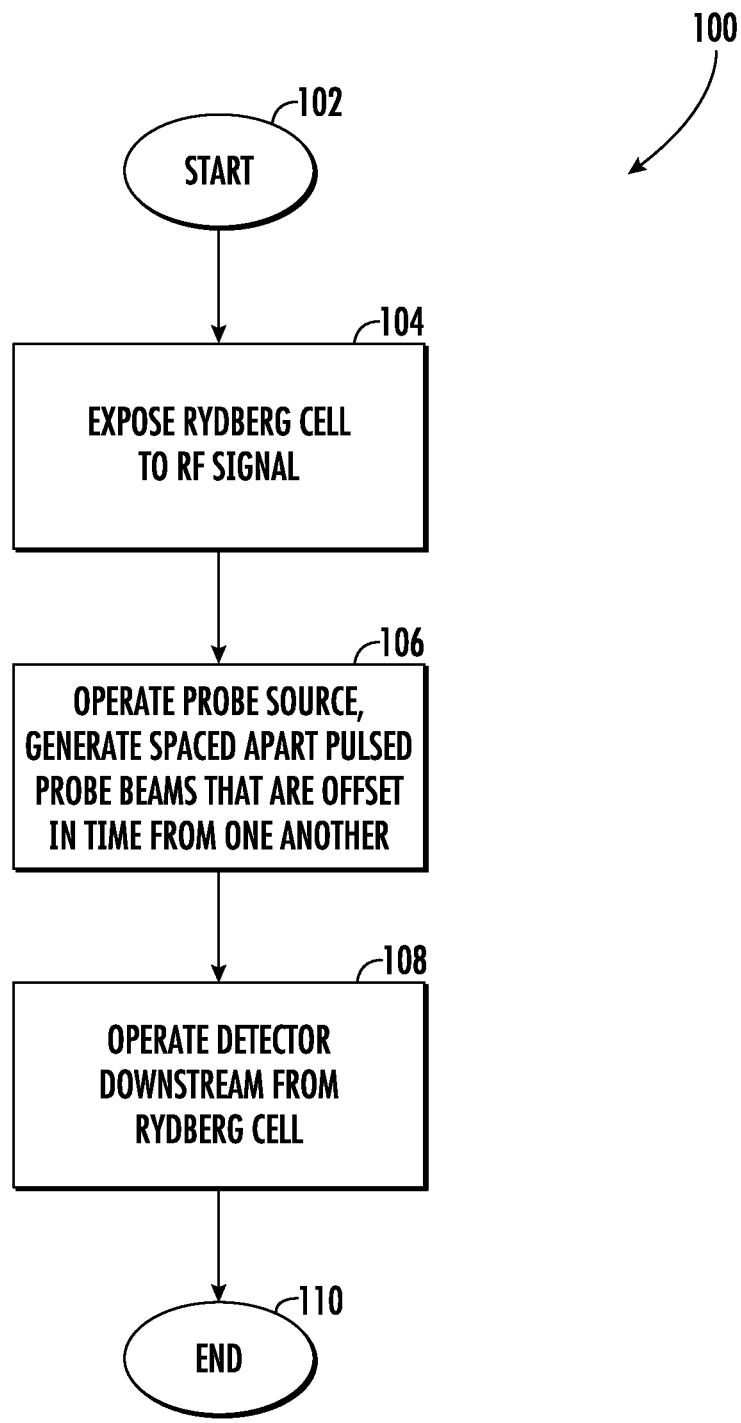
FIG. 6 is a high-level flowchart of a method for receiving an RF signal using the sensor receiver of FIG. 1.

Referring now to FIG. 6, there is illustrated generally at 100 a method for receiving an RF signal using the sensor receiver 20 of FIG. 1. The method starts (Block 102) and the Rydberg cell 22 is exposed to the RF signal (Block 104). The probe source 28 is operated to generate a plurality of spaced apart pulsed probe beams 30 within the Rydberg cell 22, with the pulsed probe beams being offset in time from each other (Block 106). The detector 32 is operated downstream from the Rydberg cell 22 (Block 108) and the process ends (Block 110).

Figure 7:
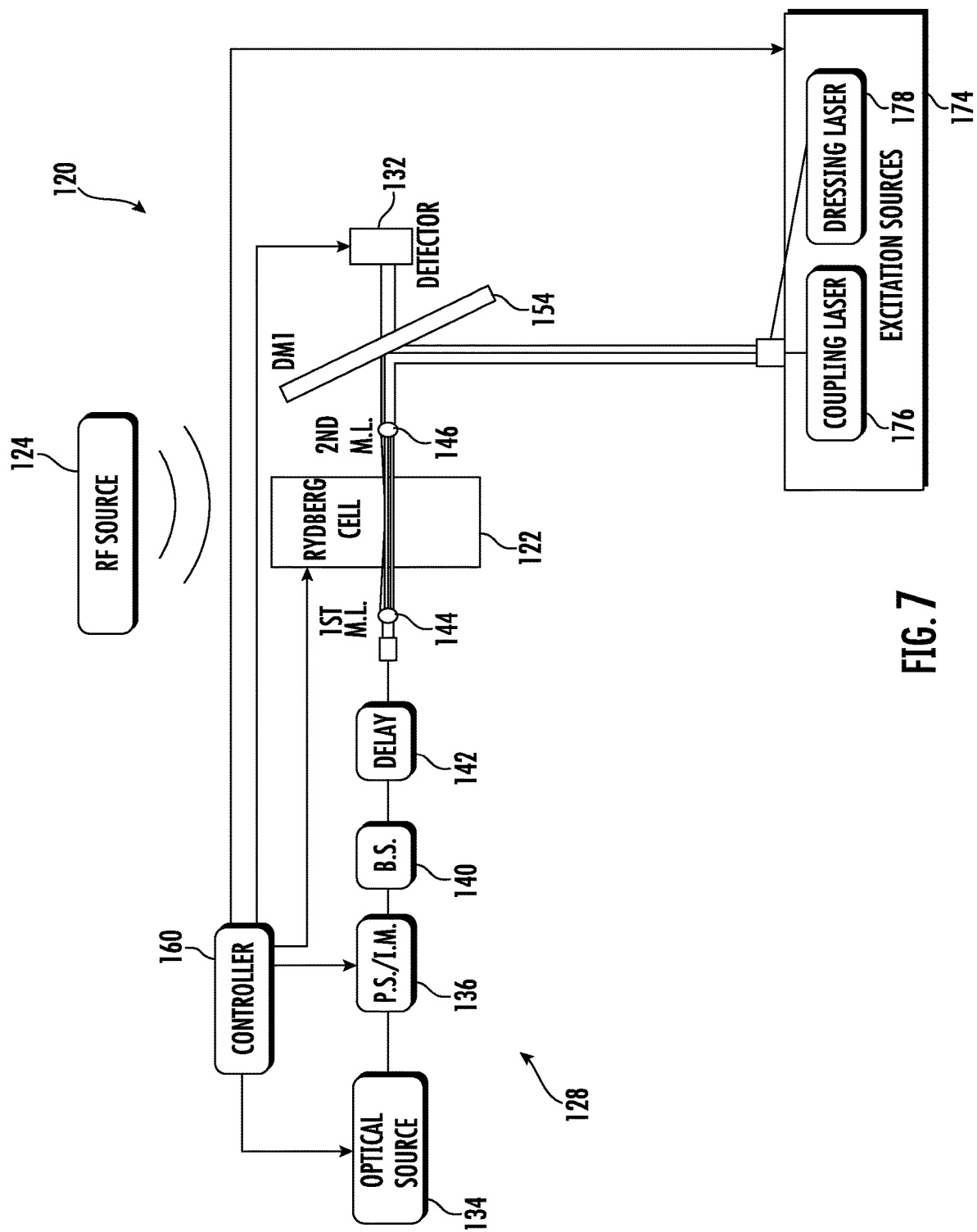
FIG. 7 is a schematic block diagram of the sensor receiver having the plurality of excitation sources according to the invention.

Referring now to FIG. 7, there is illustrated a schematic block diagram of the sensor receiver 120 that incorporates a plurality of excitation sources that are illustrated generally at 174 and include a coupling laser 176 and dressing laser 178. For purposes of description, similar reference numerals describing similar functional components as described relative to the sensor receiver 20 of FIG. 1 are set forth with reference to the description of the sensor receiver 120 of FIG. 7, but using reference numerals in the 100 series.

The sensor receiver 120 includes a Rydberg cell 122 configured to be exposed to a radio frequency (RF) signal shown as the RF source 124. A probe source 128 is configured to generate a plurality of spaced apart pulsed probe beams within the Rydberg cell 122 with the pulsed probe beams being offset and timed from one another. A plurality of excitation sources 174 are coupled to the Rydberg cell 122 in a counter-propagating direction from the probe source 134. A detector 132 is downstream from the Rydberg cell 122.

The plurality of excitation sources 174 may comprise a plurality of excitation lasers illustrated as the coupling laser 176 and dressing laser 178. The excitation lasers 176, 178 may have different frequencies and may each comprise a continuous laser in an example. The probe source 128 may be configured to generate the plurality of spaced apart pulsed probe beams without scanning. The probe source 128 may be formed as an optical source 134, such as a laser, and a pulse shaper 136 is downstream from the optical source. The pulse shaper 136 may include an intensity modulator. The probe source 128 may also include a beam splitter 140 downstream from the pulse shaper 136 and a respective optical delay element 142 in a path of each beam downstream from the beam splitter. In an example, the optical delay element 142 may be formed as respective different lengths of optical fiber. In another example, a first microlens 144 is adjacent a first side of the Rydberg cell 122 and a second microlens 146 is adjacent a second side of the Rydberg cell 122.

The coupling laser 176 and dressing laser 178 may be continuous wave or pulsed and arranged in different configurations with the lasers co-propagating and counter-propagating with each other, and co-propagating and counter-propagating with the probe source 128. Example embodiments for specific transitions may include wavelengths that may change based on the RF frequency that the sensor receiver 120 is configured to detect. For the three laser RF configuration as illustrated in FIG. 7, the coupling laser 176 may be at 1,260 nanometers and may be a pulsed laser beam. The optical source 134 as a laser could operate at 780 nanometers and the dressing laser may operate at 776 nanometers, and both are not pulsed. In another example, the dressing laser 178 could be pulsed and the optical source 134 as a laser and coupling laser 176 are not pulsed. This allows the evolution of atomic populations to maximize the sensitivity that a desired optical beam has to an RF input from the RF source 124.

The controller 160 controls how the individual lasers from the optical source 134, the coupling laser 176 and the dressing laser 178 are operated on or off. The controller 160 may control the direction of each laser 134, 176, 178 through the Rydberg cell 122, and control whether individual lasers are pulsed or not pulsed. Pulse widths may range from 100 picoseconds to the continuous wave. The controller 160 may also control whether the individual lasers 134, 176, 178 are delayed in time relative to each other with delays ranging from 1 nanosecond to 1 microsecond. The coupling laser 176 may be a rubidium laser.

Figure 8:
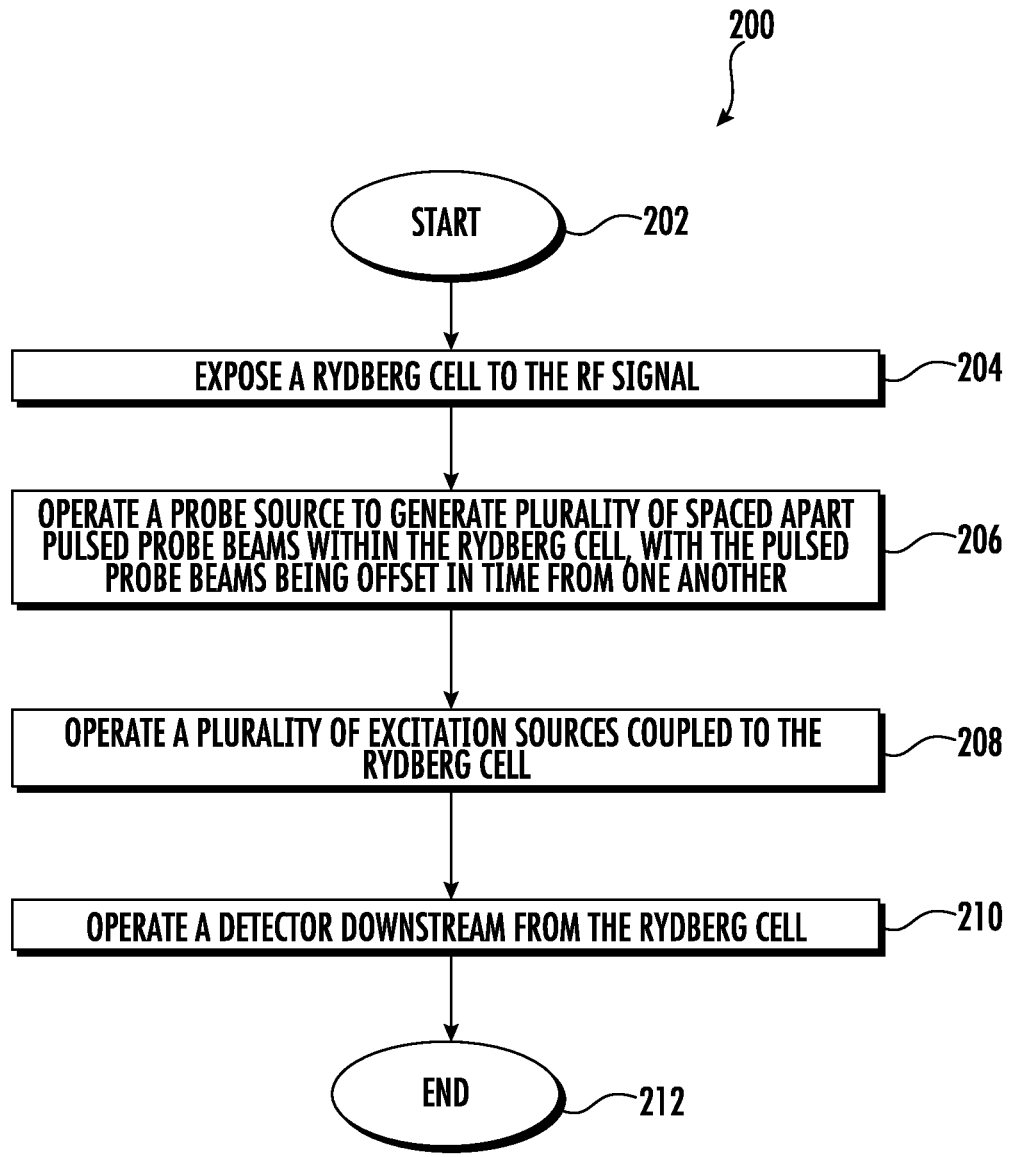
FIG. 8 is a high-level flowchart of a method for receiving an RF signal using the sensor receiver of FIG. 7.

Referring now to FIG. 8, there is illustrated generally at 200 a method for receiving an RF signal using the sensor receiver 120 of FIG. 7. The method starts (Block 202) and the Rydberg cell 122 is exposed to the RF signal (Block 204). The probe source 128 is operated to generate a plurality of spaced apart pulsed probe beams within the Rydberg cell 122, with the pulsed probe beams being offset in time from each other (Block 206). A plurality of excitation sources 174 that are coupled to the Rydberg cell 122 are operated in a counter-propagating direction from the probe source 128 (Block 208). A detector 132 is operated downstream from the Rydberg cell 122 (Block 210). The process ends (Block 212).

Figure 9:
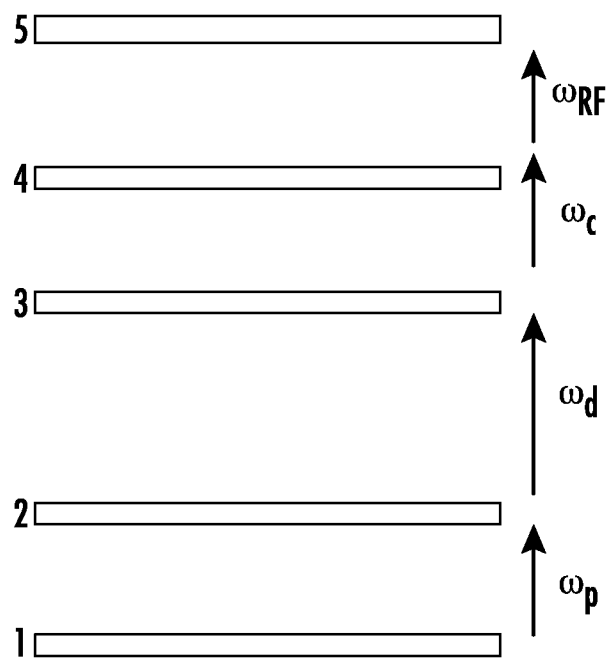
FIG. 9 is a diagram illustrating the different transition energy level states when operating the sensor receiver of FIG. 7.

Referring now to FIG. 9, there are shown five different transition energy level states for the sensor receiver 120 shown in FIG. 7. As illustrated, the atom starts in the ground state |1⟩ and the device applies fields $\omega_p$, $\omega_d$, $\omega_c$ and RF $\omega_{RF}$ to drive dipole transitions |1⟩→|2⟩, |2⟩→|3⟩, |3⟩→|4⟩ and |4⟩→|5⟩ respectively. These beams are referred to as the probe 134, dressing 178, coupling 176, and RF signal 124. The single photon detunings are defined from the exact transition resonances as:

$$\Delta_p = \omega_{21} - \omega_p - k_p v$$

$$\Delta_d = \omega_{32} - \omega_d + k_d v$$

$$\Delta_c = \omega_{43} - \omega_c + k_c v$$

$$\Delta_{RF} = \omega_{54} - \omega_{RF} - k_{RF,\parallel} v$$

where $\omega_{ji}$ is the |i⟩→|j⟩ transition frequency and Doppler shifts have been explicitly included. The two-photon detuning is also defined as $\Delta_2 = \Delta_p + \Delta_d$, the three-photon detuning is defined as $\Delta_3 = \Delta_2 + \Delta_c$, and the four photon detuning is defined as $\Delta_4 = \Delta_3 + \Delta_{RF}$. It should be understood that |i⟩→|j⟩ is a dipole forbidden transition, if i and j have the same parity.

The dipole transition Hamiltonian is given by:

$$H_{dipole} = -\hat{d}\cdot\vec{E}(t) = -\hat{d}\cdot(\vec{E}_p(t) + \vec{E}_d(t) + \vec{E}_c(t) + \vec{E}_{RF}(t))$$

where $\vec{E}_j = E_j \cos(\omega_j t)$. It is possible to expand the dipole operator in terms of the atomic states as:

$$\hat{d} = \sum_{j,l} |j\rangle\langle j|\hat{d}|l\rangle\langle l| = \sum_{j,l} d_{jl}\sigma_{jl} \quad j,l \in [1,2,3,4,5]$$

where the atomic level orthogonal projector operators are defined as $\sigma_{j,l} = |j\rangle\langle l|$. The dipole forbidden transitions have $d_{ij} = 0$. The dipole Hamiltonian is written:

$$H_{dipole} = -\frac{1}{2}\sum_{l,m,k} d_{lm}E_k e^{-i\omega_k t}\sigma_{lm} + h \cdot c.$$

The background atomic Hamiltonian is:

$$H_0 = \Sigma_{i>1}\hbar\omega_{i,1}\sigma_{ii}.$$

In writing the atomic Hamiltonian this way, all the transition frequencies are relative to the ground state. This form currently allows for non-energy conserving transitions such as w, pumping from level 1 to 2, or any single beam driving the (dipole allowed) transition 1 to 4. These terms can be removed such that:

$$H_{dipole} = \frac{-\hbar}{2}\left(\Omega_p\sigma_{21}\left(e^{-i\omega_p t} + e^{i\omega_p t}\right) + \Omega_d\sigma_{32}\left(e^{-i\omega_d t} + e^{i\omega_d t}\right) + \right.$$
$$\left. \Omega_c\sigma_{43}\left(e^{-i\omega_c t} + e^{i\omega_c t}\right) + \Omega_{RF}\sigma_{54}\left(e^{-i\omega_{RF} t} + e^{i\omega_{RF} t}\right) + h \cdot c\right)$$

where the Rabi frequency is $$\Omega_j = \frac{dE_j(L)}{\hbar}.$$

The Rabi frequency is not the transition frequency, but is associated with the transition rate between the two levels. It is possible to simplify later calculations by moving into a rotating frame using the unitary transform:

$$R = |1\rangle\langle 1| + e^{i\omega_p t}|2\rangle\langle 2| + e^{i(\omega_p+\omega_d)t}|3\rangle\langle 3| + e^{i(\omega_p+\omega_c+\omega_d)t}|4\rangle\langle 4| +$$
$$e^{i(\omega_p+\omega_c+\omega_d+\omega_{RF})t}|5\rangle\langle 5|.$$

The interaction dynamics come from the equation of motion:

$$\frac{d\rho}{dt} = \frac{1}{i\hbar}[H,\rho]$$

where the density matrix $\rho = \Sigma_{i,j}\rho_{ij}(t)\sigma_{ij}$. It is possible to transform to the rotating frame by inserting:

$$\frac{d}{dt}R^+R\rho R^+R = \frac{1}{i\hbar}(R^+RHR^+R\rho R^+R - R^+R\rho R^+RHR^+R).$$

Identifying $\rho \to R\rho R^+$, $H \to RHR^+$ and dropping the fast oscillating terms, the full Hamiltonian is given by:

$$H = \hbar\Delta_p\sigma_{22} + \hbar\Delta_2\sigma_{33} + \hbar\Delta_3\sigma_{44} +$$
$$\hbar\Delta_4\sigma_{55} + \frac{-\hbar}{2}(\Omega_p\sigma_{21} + \Omega_d\sigma_{32} + \Omega_c\sigma_{43} + \Omega_{RF}\sigma_{54} + h \cdot c).$$

This equation fails to capture any damping effects from spontaneous emission or dephasing. These effects can be added in by including the terms:

$$\frac{d\rho}{dt} = \frac{1}{i\hbar}[H,\rho] +$$

-continued $$\frac{1}{2}\sum_{i>j}\Gamma_{ij}(2\sigma_{ji}\rho\sigma_{ij} - \sigma_{ii}\rho - \rho\sigma_{ii}) + \frac{1}{2}\sum_{i>1}\gamma_i(2\sigma_{ii}\rho\sigma_{ii} - \sigma_{ii}\rho - \rho\sigma_{ii})$$

Here $\Gamma_{ij}$ gives the rate of spontaneous decay from level i to level j, and $\gamma_i$ are energy conserving dephasing terms. The effect of the RF field can be observed through the transmission of the probe beam through the medium. The intensity of the probe beam after propagating through a distance L of the atomic medium is:

$$I = I_0 e^{\frac{-2\pi Im[\chi^1(\omega_p)]}{\lambda_p}L}.$$

The linear susceptibility $\chi^{(1)}(\omega_p)$ relates the linear polarization of the medium to the applied electric field. It is possible to assume that all the fields have the same polarization:

$$P^{(1)}(t) = N\langle p(t)\rangle = NTr[\hat{d}\rho] = N\sum_{ij}\left(d_{ij}\rho_{ji}(t)e^{-i\omega_p t} + c \cdot c.\right) =$$
$$\epsilon_0\sum_l\left(\chi^{(1)}(\omega_l)(E_l(\omega_l)e^{-i\omega_l t} + c \cdot c.)\right) \to \chi^{(1)}(\omega_p) = \frac{N}{\epsilon_0 E_p}d_{12}\rho_{21}$$

where N is the atomic number density and $\langle \vec{p}(t)\rangle$ is the electric dipole moment. To find $\chi^{(1)}(\omega_p)$, the density matrix elements that oscillate at co should first be found.

To simplify the equations, the following groupings may be made (note since $\Gamma_{ij}=\Gamma_{ji}$, $\gamma_{ij}=\gamma_{ji}$)

$$\gamma_{21} = \frac{1}{2}(\Gamma_{21} + \gamma_2)$$

$$\gamma_{31} = \frac{1}{2}(\Gamma_{32} + \Gamma_{31} + \gamma_3)$$

$$\gamma_{41} = \frac{1}{2}(\Gamma_{41} + \Gamma_{42} + \Gamma_{43} + \gamma_4)$$

$$\gamma_{51} = \frac{1}{2}(\Gamma_{51} + \Gamma_{52} + \Gamma_{53} + \Gamma_{54} + \gamma_5)$$

$$\gamma_{32} = \frac{1}{2}(\Gamma_{21} + \Gamma_{31} + \Gamma_{32} + \gamma_2 + \gamma_3)$$

$$\gamma_{42} = \frac{1}{2}(\Gamma_{21} + \Gamma_{41} + \Gamma_{42} + \Gamma_{43} + \gamma_2 + \gamma_4)$$

$$\gamma_{43} = \frac{1}{2}(\Gamma_{31} + \Gamma_{32} + \Gamma_{41} + \Gamma_{42} + \Gamma_{43} + \gamma_3 + \gamma_4)$$

$$\gamma_{52} = \frac{1}{2}(\Gamma_{21} + \Gamma_{51} + \Gamma_{52} + \Gamma_{53} + \Gamma_{54} + \gamma_2 + \gamma_5)$$

$$\gamma_{53} = \frac{1}{2}(\Gamma_{31} + \Gamma_{32} + \Gamma_{51} + \Gamma_{52} + \Gamma_{53} + \Gamma_{54} + \gamma_3 + \gamma_5)$$

$$\gamma_{54} = \frac{1}{2}(\Gamma_{41} + \Gamma_{42} + \Gamma_{43} + \Gamma_{51} + \Gamma_{52} + \Gamma_{53} + \Gamma_{54} + \gamma_4 + \gamma_5)$$

Also, it is possible to assume that all the Rabi frequencies are real $\Omega_i = \Omega_i^*$, $$\dot{\rho}_{11} = -\frac{i\Omega_p}{2}(\rho_{12} - \rho_{21}) + \Gamma_{21}\rho_{22} + \Gamma_{31}\rho_{33} + \Gamma_{41}\rho_{44} + \Gamma_{51}\rho_{55}$$

-continued $$\dot{\rho}_{22} = \frac{i\Omega_p}{2}(\rho_{12} - \rho_{21}) - \frac{i\Omega_d}{2}(\rho_{23} - \rho_{32}) - \Gamma_{21}\rho_{22} + \Gamma_{32}\rho_{33} + \Gamma_{42}\rho_{44} + \Gamma_{52}\rho_{55}$$

$$\dot{\rho}_{33} = \frac{i\Omega_d}{2}(\rho_{23} - \rho_{32}) - \frac{i\Omega_c}{2}(\rho_{34} - \rho_{43}) - (\Gamma_{31} + \Gamma_{32})\rho_{33} + \Gamma_{43}\rho_{44} + \Gamma_{53}\rho_{55}$$

$$\dot{\rho}_{44} = \frac{i\Omega_d}{2}(\rho_{34} - \rho_{43}) - \frac{i\Omega_{RF}}{2}(\rho_{45} - \rho_{54}) - (\Gamma_{41} + \Gamma_{42} + \Gamma_{43})\rho_{44} + \Gamma_{54}\rho_{55}$$

$$\dot{\rho}_{55} = \frac{i\Omega_{RF}}{2}(\rho_{45} - \rho_{54}) - (\Gamma_{51} + \Gamma_{52} + \Gamma_{53} + \Gamma_{54})\rho_{55}$$

$$\dot{\rho}_{21} = -\frac{i}{2}\Omega_p(\rho_{22} - \rho_{11}) + \frac{i}{2}\Omega_d\rho_{31} - (\gamma_{21} + i\Delta_p)\rho_{21}$$

$$\dot{\rho}_{32} = -\frac{i}{2}\Omega_d(\rho_{33} - \rho_{22}) - \frac{i}{2}\Omega_p\rho_{31} + \frac{i}{2}\Omega_c\rho_{42} - (\gamma_{32} + i\Delta_d)\rho_{32}$$

$$\dot{\rho}_{31} = -\frac{i}{2}\Omega_p\rho_{32} + \frac{i}{2}\Omega_d\rho_{21} + \frac{i}{2}\Omega_c\rho_{41} - (\gamma_{31} + i\Delta_2)\rho_{31}$$

$$\dot{\rho}_{41} = -\frac{i}{2}\Omega_p\rho_{42} + \frac{i}{2}\Omega_c\rho_{31} + \frac{i}{2}\Omega_{RF}\rho_{51} - (\gamma_{41} + i\Delta_3)\rho_{41}$$

$$\dot{\rho}_{42} = -\frac{i}{2}\Omega_d\rho_{43} - \frac{i}{2}\Omega_p\rho_{41} + \frac{i}{2}\Omega_c\rho_{32} + \frac{i}{2}\Omega_{RF}\rho_{52} - (\gamma_{42} + i(\Delta_c + \Delta_d))\rho_{42}$$

$$\dot{\rho}_{43} = -\frac{i}{2}\Omega_c(\rho_{44} - \rho_{33}) - \frac{i}{2}\Omega_d\rho_{42} + \frac{i}{2}\Omega_{RF}\rho_{53} - (\gamma_{43} + i\Delta_c)\rho_{43}$$

$$\dot{\rho}_{51} = -\frac{i}{2}\Omega_p\rho_{52} + \frac{i}{2}\Omega_{RF}\rho_{41} - (\gamma_{51} + i\Delta_4)\rho_{51}$$

$$\dot{\rho}_{52} = -\frac{i}{2}\Omega_d\rho_{53} - \frac{i}{2}\Omega_p\rho_{51} + \frac{i}{2}\Omega_{RF}\rho_{42} - (\gamma_{52} + i(\Delta_4 - \Delta_p))\rho_{52}$$

$$\dot{\rho}_{53} = -\frac{i}{2}\Omega_c\rho_{54} - \frac{i}{2}\Omega_d\rho_{52} + \frac{i}{2}\Omega_{RF}\rho_{43} - (\gamma_{53} + i(\Delta_4 - \Delta_2))\rho_{53}$$

$$\dot{\rho}_{54} = -\frac{i}{2}\Omega_{RF}(\rho_{55} - \rho_{44}) - \frac{i}{2}\Omega_c\rho_{53} - (\gamma_{54} + i\Delta_{RF})$$

These equations can be reorganized into the matrix equation:

$$\vec{\dot{\rho}} = A\vec{\rho}$$

where A is a coefficient matrix and $\vec{\rho} = \rho_{ij}$. The steady state solution is obtained by setting $\vec{\dot{\rho}} = 0$ and numerically solving for the null space of A.

Figure 10:
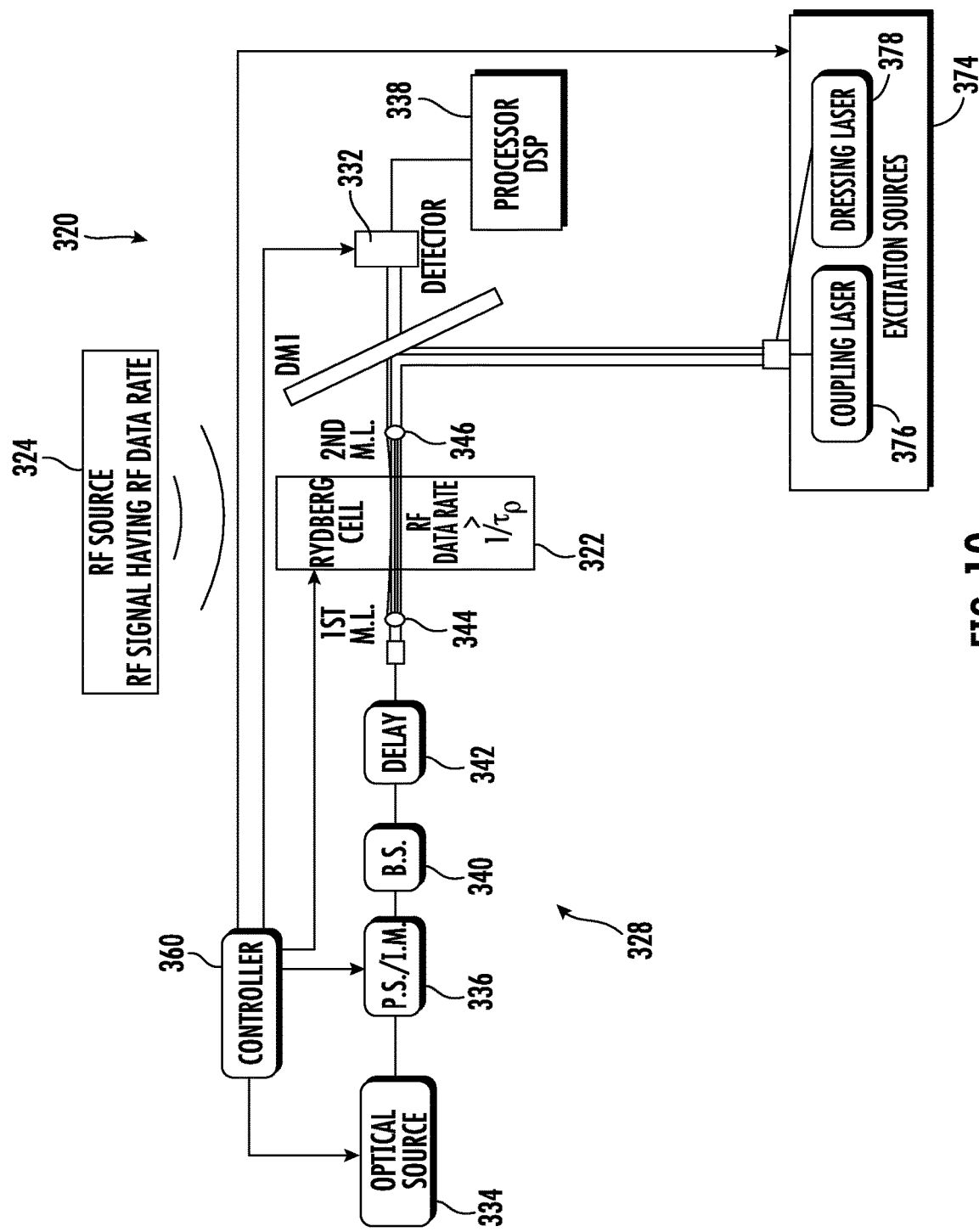
FIG. 10 is a schematic block diagram of the sensor receiver where the received RF data rate is greater than the reciprocal of the temporal pulse width.

Referring now to FIG. 10, there is illustrated a schematic block diagram of the sensor receiver 320 that may demodulate RF bit streams having an RF data rate that is greater than the reciprocal of the temporal pulse width. The sensor receiver 320 may demodulate RF bit streams at 100 MHz and higher using sub-pulse width sampling rate DSP algorithms that extract additional information about the incoming RF field from subtle features in individual probe pulses and reconstruct the incoming RF bit stream at speeds that either exceed the sampling rate increase provided by the sensor receiver 320 alone, or which reduce the complexity. The temporal shape of the probe response with a minimum time bin that can be physically sampled yields additional information that may be used to increase the effective Instantaneous Bandwidth (IBW) of the sensor receiver 320.

The sensor receiver 320 may have at least one excitation source, and as in the sensor receiver of 120 in FIG. 7, may incorporate a plurality of excitation sources that are illustrated generally at 374 and include a coupling laser 376 and dressing laser 378. For purposes of description, similar reference numerals describing similar functional components as described relative to the sensor receiver 120 of FIG. 7 are set forth with reference to the description of the sensor receiver 320 of FIG. 10, but using reference numerals in the 300 series.

The sensor receiver 320 includes a Rydberg cell 322 configured to be exposed to a radio frequency (RF) signal having an RF data rate as shown as the RF source 324. A probe source 328 is configured to generate a plurality of spaced apart pulsed probe beams within the Rydberg cell 322. Each probe pulse in this example has a temporal width so that the RF data rate is greater than the reciprocal of the temporal pulse width (RF data rate is greater than $1/\tau_p$). In an example, the pulsed probe beams are offset and timed from one another. At least one excitation source 374 is coupled to the Rydberg cell 322, in this example, in a counter-propagating direction from the probe source 334, and in the illustrated example, shown as a plurality of excitation sources. A detector 332 is downstream from the Rydberg cell 322 and has connected thereto a processor 338 formed in an example as a Digital Signal Processor (DSP) that processes the detected probe pulses using super-pulse, e.g., sub-pulse width sampling rate DSP algorithms. The processor 338 in an example may be configured to classify RF bit sequences based upon temporal profiles of detected pulses.

The plurality of excitation sources 374 may comprise a plurality of excitation lasers illustrated as the coupling laser 376 and dressing laser 378. The excitation lasers 376, 378 may have different frequencies and may each comprise a continuous laser in an example. The probe source 328 may be configured to generate the plurality of spaced apart pulsed probe beams without scanning. The probe source 328 may be formed as an optical source 334, such as a laser, and a pulse shaper 336 is downstream from the optical source. The pulse shaper 336 may include an intensity modulator. The probe source 328 may also include a beam splitter 340 downstream from the pulse shaper 336 and a respective optical delay element 342 in a path of each beam downstream from the beam splitter. In an example, the optical delay element 342 may be formed as respective different lengths of optical fiber. In another example, a first microlens 344 is adjacent a first side of the Rydberg cell 322 and a second microlens 346 is adjacent a second side of the Rydberg cell 322.

The coupling laser 376 and dressing laser 378 may be continuous wave or pulsed and arranged in different configurations with the lasers co-propagating and counter-propagating with each other, and co-propagating and counter-propagating with the probe source 328. Example embodiments for specific transitions may include wavelengths that may change based on the RF frequency that the sensor receiver 320 is configured to detect. For this three laser RF configuration as illustrated in FIG. 10, the coupling laser 376 may be at 1,260 nanometers and may be a pulsed laser beam. The optical source 334 as a laser could operate at 780 nanometers and the dressing laser may operate at 776 nanometers, and both are not pulsed. In another example, the dressing laser 378 could be pulsed and the optical source 334 as a laser and coupling laser 376 are not pulsed. This allows the evolution of atomic populations to maximize the sensitivity that a desired optical beam has to an RF input from the RF source 324.

The controller 360 controls how the individual lasers from the optical source 334, the coupling laser 376 and the dressing laser 378 are operated on or off. The controller 360 may control the direction of each laser 334, 376, 378 through the Rydberg cell 322, and control whether individual lasers are pulsed or not pulsed. Pulse widths may range from 100 picoseconds to the continuous wave. The controller 360 may also control whether the individual lasers 334, 376, 378 are delayed in time relative to each other with delays ranging from 1 nanosecond to 1 microsecond. The coupling laser 376 may be a rubidium laser.

Figure 10A:
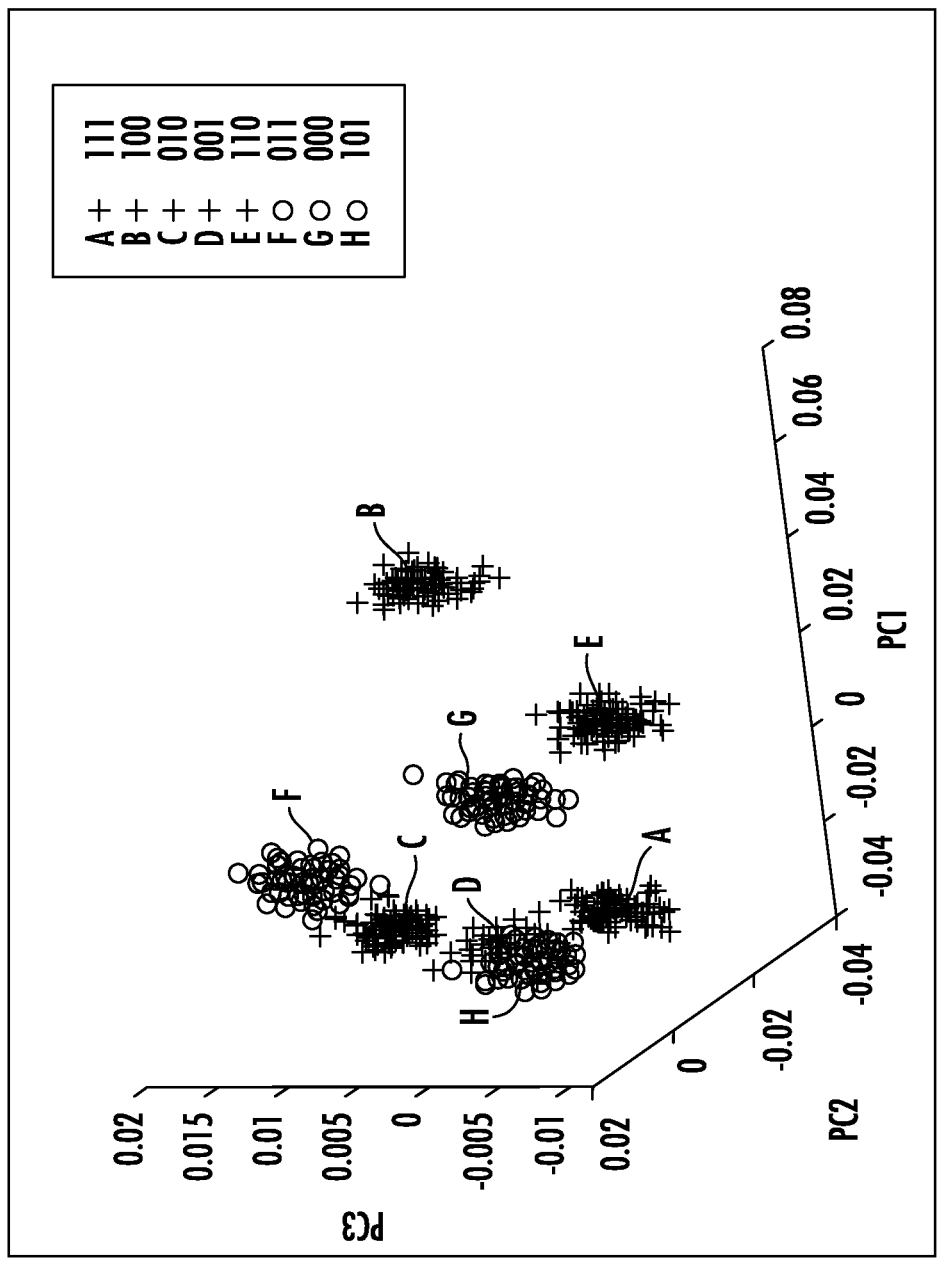
FIG. 10A is a principal component analysis graph of a first example of RF bit sequences.

The configuration of the sensor receiver 320 as described allows a reduction in the complexity and the size, weight and power (SWaP) of the sensor receiver by a factor of 3 or 4, allowing the Rydberg cell 322 to retain a desirable small form factor and reduce the number of independent beams that are required to achieve a 100 MHz IBW from 50 beams to 16 and 13 beams respectively in the non-limiting example as described. For example, an incoming RF signal 324 may have a 100 MHz RF data rate and the Rydberg cell 322 may have 30 nanosecond probe pulses and 500 nanosecond repetition rate with −10 dBm RF power, and a 45 MHz detector bandwidth. The Rydberg cell 322 may require 16 probe beams and have three RF bits under each probe pulse as illustrated in the principal component analysis graph of FIG. 10A. In another example shown in the principal component analysis graph of FIG. 10B having different illustrated RF bit groupings, using a 40 nanosecond probe pulse, 500 nanosecond repetition rate, 10 dBm of RF power and the 300 MHz detector bandwidth, 13 probe beams may be required for the sensor receiver 320 with four RF bits underneath each probe pulse. Super-sampling the RF field is enabled by algorithms that classify the resultant temporal shape of the probe laser beam pulses using, for example, neural network classification or principal component analysis with T-test for reduced complexity and boosting IBW to greater than 100 MHz.

The sensor receiver as described 320 includes a pulse probe spatiotemporal multiplexing architecture that focuses on the interleaving of spatial zones and pulse timing to extract a faster response time from the Rydberg cell 322. While each probe of a beam pulse is separated spatially, the Rydberg cell 322 is still limited by the atomic relaxation time. The sensor receiver 320 spatially and temporally offsets each probe pulse, sending each probe pulse through different interaction zones of the Ryberg cell 322. The absorption signals are then focused onto the single detector 332 to capture the output stream, which is processed at the processor 338.

Figure 11:
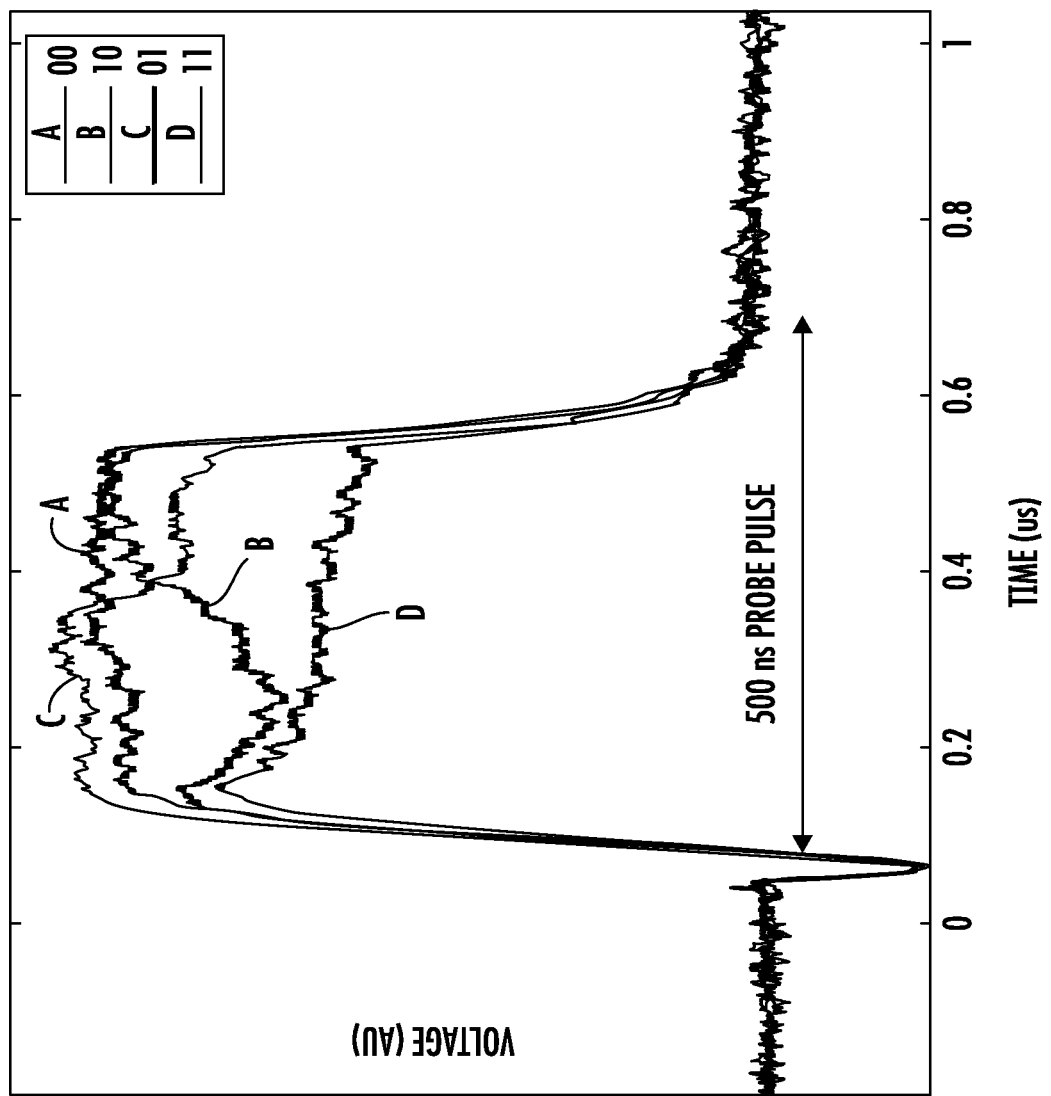
FIG. 11 is a graph showing results from the sensor receiver of FIG. 10.
Figure 12:
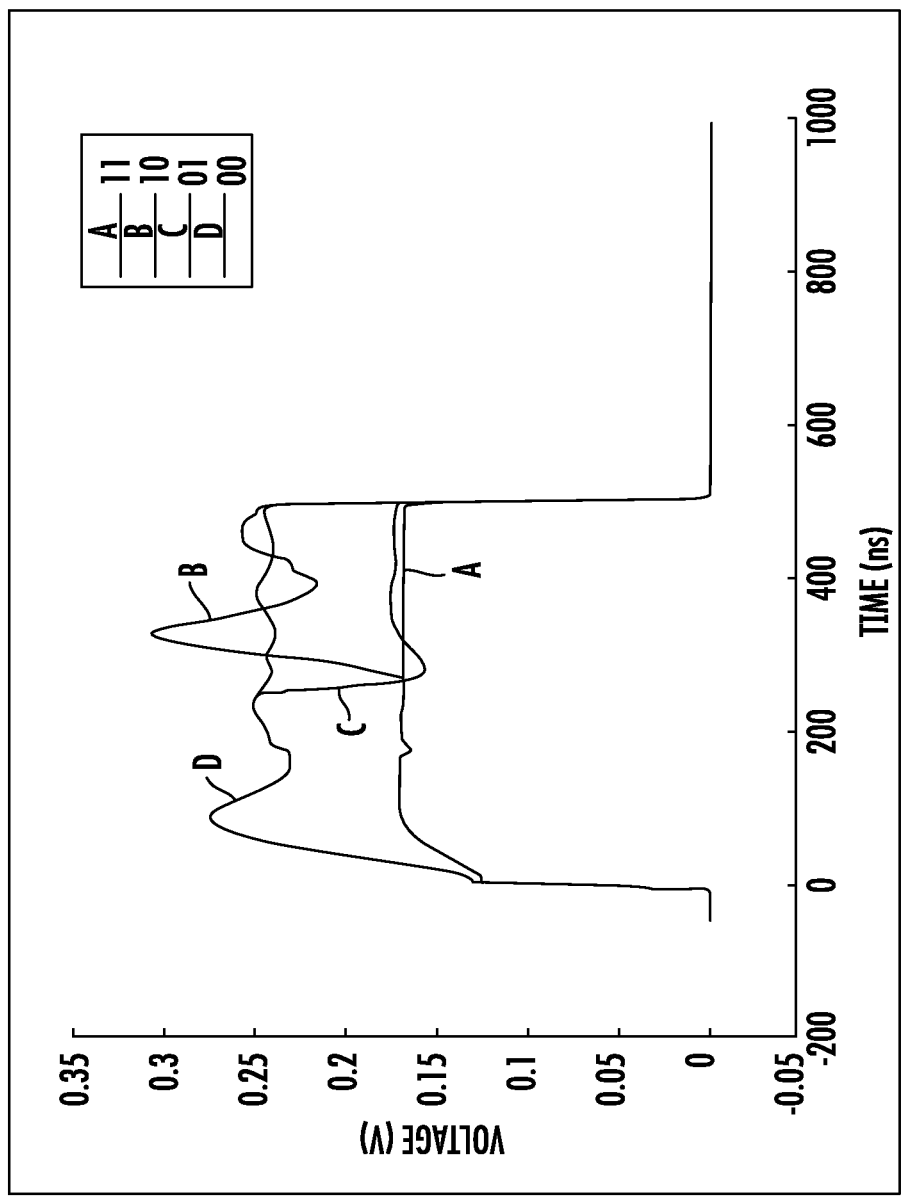
FIG. 12 is a graph showing results from a computer simulation model of the sensor receiver of FIG. 10.

Referring now to the graph of FIG. 11, the experimental results using the sensor receiver 320 of FIG. 10 are illustrated where the response of the sensor receiver to various combinations of two bit on off keying (OOK) RF bit sequences are shown when using a probe pulse of 500 nanoseconds, which was longer than the duration of an RF bit of 250 nanoseconds. The different bit sequences are displayed as the illustrated lines A-D, each having unique temporal profiles corresponding to the lines A as 00, B as 10, C as 01, and D as 11. The graph in FIG. 12 shows the results from a computer simulated model with line A corresponding to 11, line B as 10, line C as 01, and line D as 00. The unique temporal profiles in the graph of FIG. 12 confirm the experimental results.

Figure 13:
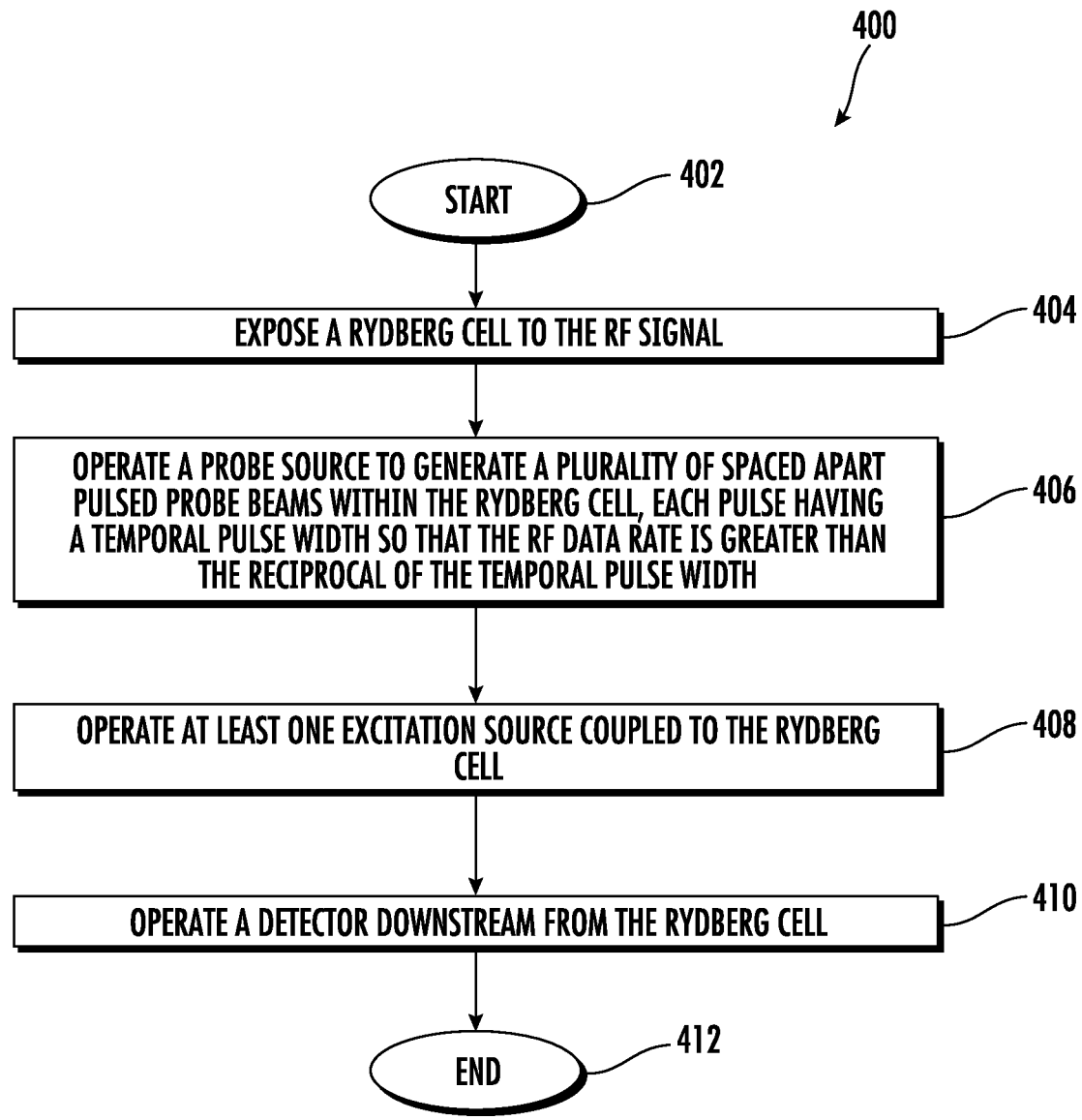
FIG. 13 is a high-level flowchart of a method for receiving an RF signal using the sensor receiver of FIG. 10.

Referring now to FIG. 13, there is illustrated generally at 400 a flowchart for a method of receiving an RF signal using the sensor receiver 320 of FIG. 10. The method starts (Block 402) and the Rydberg cell 322 is exposed to the RF signal (Block 404). The probe source 328 is operated to generate a plurality of spaced apart pulsed probe beams within the Rydberg cell 322. Each pulse has a temporal pulse width so that the RF data rate is greater than the reciprocal of the temporal pulse width (Block 406). At least one excitation source 374 is coupled to the Rydberg cell 322 (Block 408).

A detector 332 is operated downstream from the Rydberg cell 322 (Block 410). The process ends (Block 412).

Figure 14:
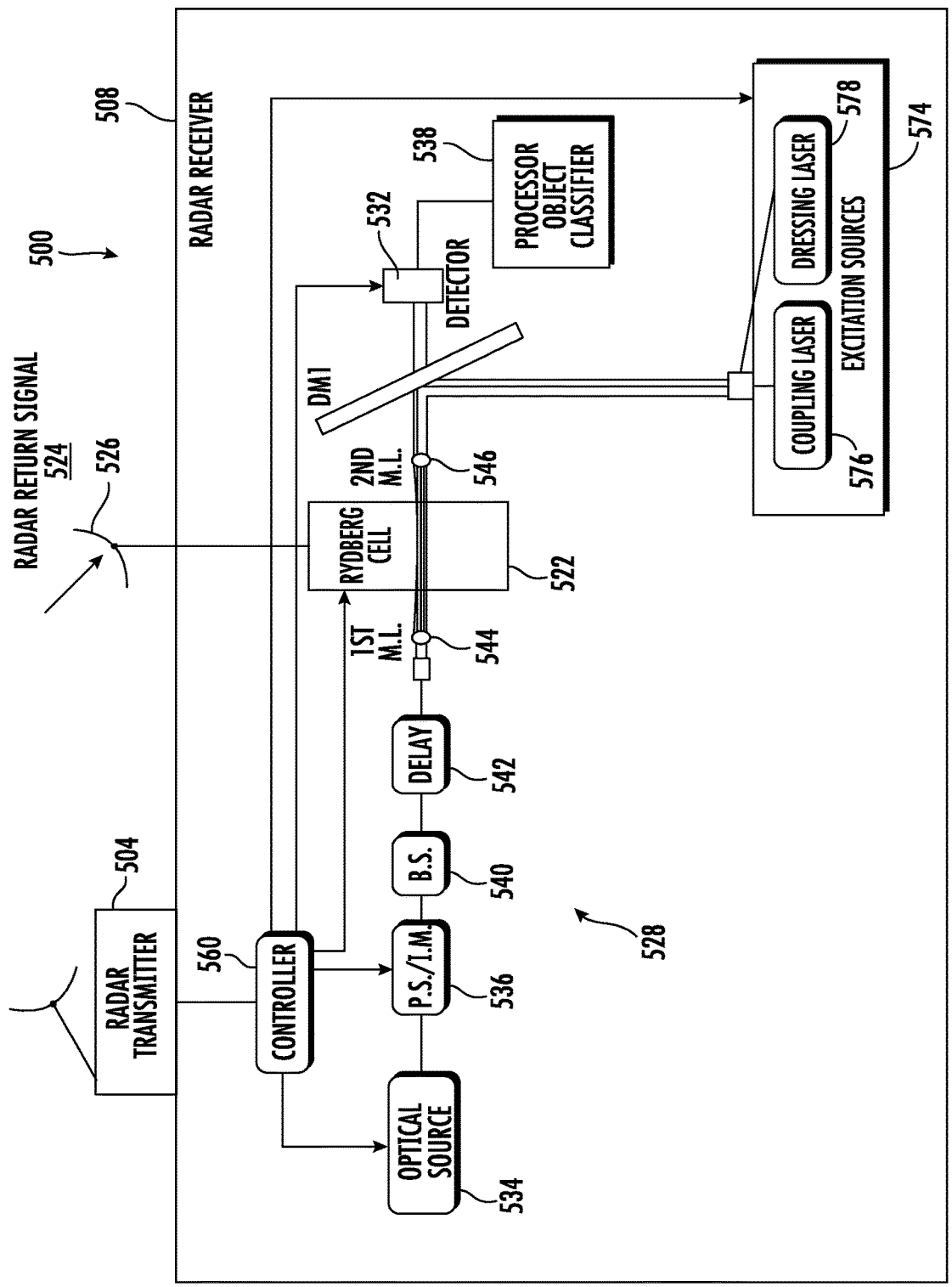
FIG. 14 is a schematic block diagram of a radar according to the invention.

Referring now to FIG. 14, there is illustrated at 500 a radar that includes a radar transmitter 504 and a radar receiver 508 cooperating therewith. A Rydberg cell 522 may be configured to be exposed to a radar return signal 524, for example, over a plurality of spaced apart frequency bands, such as received via a radar pulse receiving antenna 526 coupled to the Rydberg cell. A probe source 528 is configured to generate a plurality of spaced apart pulsed probe beams within the Rydberg cell 522. At least one excitation source 574 is coupled to the Rydberg cell 522. A detector 532 is positioned downstream from the Rydberg cell 522.

A processor 538 is coupled to the detector 532 and operates as an object classifier using Digital Signal Processing (DSP) algorithms. The processor 532 operating as an object classifier provides maximum differentiation between different objects. Radar cross-sections are wavelength dependent and provide an additional degree of freedom for differentiating between object properties.

The radar 500 detects multiple and optimally selected RF bands at a single point in space. Because the radar 500 can measure the radar cross-sections for multiple bands at a single point in space, a better representative collection of object radar cross-sections is obtained rather than lesser defined edge or angle effects, or other sources of noise, which may degrade the measured radar cross-sections of an object being detected. The ratios of various radar cross-sections are taken at different wavelengths and are classified based upon previously assembled libraries of small object metrics as a means of detecting and classifying small objects. This technique provides the advantage of being able to detect and classify objects that are smaller than the RF wavelength and provide a technique for detecting and classifying objects based on a relative, rather than an absolute measurement of the backscattered RF signal. As object size decreases, differentiating radar cross-section signal strength from environmental fluctuations can be challenging, so the ability to use a relative measurement of power, rather than an absolute measure of power, is advantageous.

As shown in FIG. 14, the radar receiver 508 incorporates at least one excitation source 574, and as illustrated, a plurality of excitation sources that include a coupling laser 576 and dressing laser 578. For purposes of description, similar reference numerals describing similar functional components as described relative to the sensor receiver 320 of FIG. 10 are set forth with reference to the description of the radar 500 of FIG. 14, but using reference numerals in the 500 series.

The radar receiver 508 includes a Rydberg cell 522 configured to be exposed to a radar return signal over the plurality of spaced apart frequency bands via the radar pulse receiving antenna 526. The probe source 528 is configured to generate the plurality of spaced apart pulsed probe beams within the Rydberg cell 522 with the pulsed probe beams being offset and timed from one another. In this example, as in the example of the Rydberg cell 322 of FIG. 10, each pulse has a temporal pulse width so that the RF data rate is greater than the reciprocal of the temporal pulse width. A plurality of excitation sources 574 are coupled to the Rydberg cell 522 in a counter-propagating direction from the probe source 534.

The plurality of excitation sources 574 may include the plurality of excitation lasers illustrated as the coupling laser 576 and dressing laser 578. The excitation lasers 576, 578 may have different frequencies and may each comprise a continuous laser in an example. The probe source 528 may be configured to generate the plurality of spaced apart pulsed probe beams without scanning. The probe source 528 may be formed as an optical source 534, such as a laser, and a pulse shaper 536 is downstream from the optical source. The pulse shaper 536 may include an intensity modulator. The probe source 538 may also include a beam splitter 540 downstream from the pulse shaper 526 and a respective optical delay element 542 in a path of each beam downstream from the beam splitter. In an example, the optical delay element 542 may be formed as respective different lengths of optical fiber. In another example, a first microlens 544 is adjacent a first side of the Rydberg cell 522 and a second microlens 546 is adjacent a second side of the Rydberg cell 522.

The coupling laser 576 and dressing laser 578 may be continuous wave or pulsed and arranged in different configurations with the lasers co-propagating and counter-propagating with each other, and co-propagating and counter-propagating with the probe source 528. Example embodiments for specific transitions may include wavelengths that may change based on the frequency of the radar return signal 524 that the radar receiver 508 is configured to detect. For the three laser RF configuration as illustrated in FIG. 14, the coupling laser 576 may be at 1,260 nanometers and may be a pulsed laser beam. The optical source 534 as a laser could operate at 780 nanometers and the dressing laser may operate at 776 nanometers, and both are not pulsed. In another example, the dressing laser 578 could be pulsed and the optical source 534 as a laser and coupling laser 576 are not pulsed. This allows the evolution of atomic populations to maximize the sensitivity that a desired optical beam has to an input from the radar pulse receiving antenna 526.

The controller 560 controls how the individual lasers from the optical source 534, the coupling laser 576 and the dressing laser 578 are operated on or off. The controller 570 may control the direction of each laser 534, 576, 578 through the Rydberg cell 522, and control whether individual lasers are pulsed or not pulsed. Pulse widths may range from 100 picoseconds to the continuous wave. The controller 560 may also control whether the individual lasers 534, 576, 578 are delayed in time relative to each other with delays ranging from 1 nanosecond to 1 microsecond. The coupling laser 576 may be a rubidium laser. The controller 560 in this example is also operatively connected to the radar transmitter 504 and controls its operation.

Figure 15:
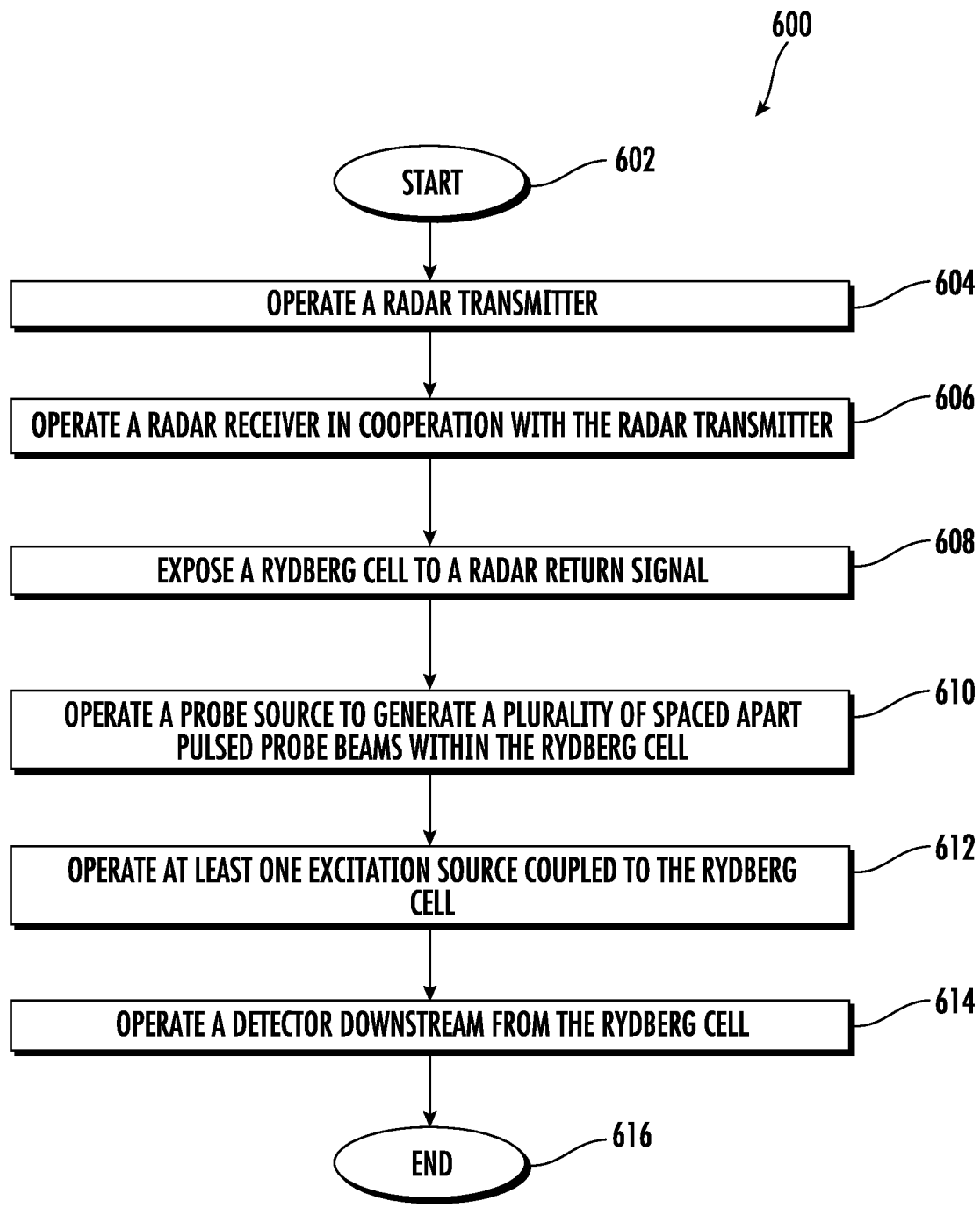
FIG. 15 is a high-level flowchart of a radar method using the radar of FIG. 14.

Referring now to FIG. 15, there is illustrated generally at 600 a method of operating the radar 500. The method starts (Block 602) and the radar transmitter 504 is operated (Block 604), and the radar receiver 508 is operated in cooperation with the radar transmitter (Block 606). The Rydberg cell 522 is exposed to a radar return signal 524 (Block 608). A probe source 528 is operated to generate a plurality of spaced apart pulsed probe beams within the Rydberg cell 522 (Block 610). The method includes operating at least one excitation source 574 coupled to the Rydberg cell 522 (Block 612) and operating the detector 532 downstream from the Rydberg cell (Block 614). The process ends (Block 616).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A sensor receiver comprising:
    a Rydberg cell configured to be exposed to a radio frequency (RF) signal having an RF data rate;
    a probe source configured to generate a plurality of spaced apart pulsed probe beams within the Rydberg cell, with each pulse having a temporal pulse width so that the RF data rate is greater than a reciprocal of the temporal pulse width;
    at least one excitation source coupled to the Rydberg cell; and
    a detector downstream from the Rydberg cell.

2. The sensor receiver of claim 1, comprising a radar pulse receiving antenna coupled to the Rydberg cell.

3. The sensor receiver of claim 1, wherein the pulsed probe beams are offset in time from one another.

4. The sensor receiver of claim 1, wherein the at least one excitation source comprises a plurality of excitation lasers.

5. The sensor receiver of claim 4, wherein the plurality of excitation lasers have different frequencies.

6. The sensor receiver of claim 4, wherein each of the plurality of excitation lasers comprises a continuous laser.

7. The sensor receiver of claim 1, wherein the probe source is configured to generate the plurality of spaced apart pulsed probe beams without scanning.

8. The sensor receiver of claim 1, wherein the probe source comprises an optical source, and a pulse shaper downstream from the optical source.

9. The sensor receiver of claim 8, wherein the probe source comprises a beam splitter downstream from the pulse shaper, and a respective optical delay element in a path of each beam downstream from the beam splitter.

10. The sensor receiver of claim 9, wherein each optical delay element comprises a respective different length of optical fiber.

11. The sensor receiver of claim 1, comprising a first microlens adjacent a first side of the Rydberg cell, and a second microlens adjacent a second side of the Rydberg cell.

12. The sensor receiver of claim 1, comprising a controller coupled to the Rydberg cell, probe source, plurality of excitation sources, and detector.

13. The sensor receiver of claim 1, wherein the at least one excitation source is coupled to the Rydberg cell in a counter-propagating direction from the probe source.

14. The sensor receiver of claim 1, comprising a processor coupled to the detector and configured to classify RF bit sequences based upon temporal profiles of detected pulses.

15. A radar comprising:
    a radar transmitter and a radar receiver cooperating therewith, the radar receiver comprising
        a Rydberg cell configured to be exposed to a radar return signal,
        a probe source configured to generate a plurality of spaced apart pulsed probe beams within the Rydberg cell,
        at least one excitation source coupled to the Rydberg cell, and
        a detector downstream from the Rydberg cell.

16. The radar of claim 15, wherein the radar receiver is configured to receive the radar return signal over a plurality of spaced apart frequency bands.

17. The radar of claim 15, comprising an object classifier coupled to the detector.

18. The radar of claim 15, wherein each pulse has a temporal pulse width so that the RF data rate is greater than the reciprocal of the temporal pulse width.

19. The radar of claim 15, wherein the pulsed probe beams are offset in time from one another.

20. The radar of claim 15, wherein the at least one excitation source comprises a plurality of excitation lasers.

21. The radar of claim 15, wherein the probe source comprises an optical source, and a pulse shaper downstream from the optical source.

22. The radar of claim 21, wherein the probe source comprises a beam splitter downstream from the pulse shaper, and a respective optical delay element in a path of each beam downstream from the beam splitter.

23. The radar of claim 22, wherein each optical delay element comprises a respective different length of optical fiber.

24. The radar of claim 15, comprising a first microlens adjacent a first side of the Rydberg cell, and a second microlens adjacent a second side of the Rydberg cell.

25. The radar of claim 15, comprising a controller coupled to the Rydberg cell, probe source, plurality of excitation sources, and detector.

26. The radar of claim 15, wherein the at least one excitation source is coupled to the Rydberg cell in a counter-propagating direction from the probe source.

27. A method for receiving a radio frequency (RF) signal having an RF data rate, the method comprising:
exposing a Rydberg cell to the RF signal;
operating a probe source to generate a plurality of spaced apart pulsed probe beams within the Rydberg cell, with each pulse having a temporal pulse width so that the RF data rate is greater than a reciprocal of the temporal pulse width;
operating at least one excitation source coupled to the Rydberg cell; and
operating a detector downstream from the Rydberg cell.

28. The method of claim 27, wherein the pulsed probe beams are offset in time from one another.

29. The method of claim 27, wherein the at least one excitation source comprises a plurality of excitation lasers.

30. The method of claim 29, wherein the plurality of excitation lasers have different frequencies.

31. The method of claim 27, wherein each of the plurality of excitation lasers comprises a continuous laser.

32. The method of claim 27, comprising generating the plurality of spaced apart pulsed probe beams without scanning.

33. The method of claim 27, comprising classifying RF bit sequences based upon temporal profiles of detected pulses.

34. A radar method comprising:
operating a radar transmitter; and
operating a radar receiver in cooperation with the radar transmitter to
expose a Rydberg cell to a radar return signal,
operate a probe source to generate a plurality of spaced apart pulsed probe beams within the Rydberg cell,
operate at least one excitation source coupled to the Rydberg cell, and
operate a detector downstream from the Rydberg cell.

35. The radar method of claim 34, wherein the radar receiver is operated to receive the radar return signal over a plurality of spaced apart frequency bands.

36. The radar method of claim 34, comprising operating an object classifier coupled to the detector.

37. The radar method of claim 34, wherein each pulse has a temporal pulse width so that the RF data rate is greater than a reciprocal of the temporal pulse width.

38. The radar method of claim 34, wherein the pulsed probe beams are offset in time from one another.

* * * * *